(12) United States Patent
Kam et al.

(10) Patent No.: US 7,839,710 B2
(45) Date of Patent: Nov. 23, 2010

(54) NANO-ELECTRO-MECHANICAL MEMORY CELLS AND DEVICES

(75) Inventors: Hei Kam, Fremont, CA (US); Tsu-Jae King, Fremont, CA (US)

(73) Assignee: The Regents of the University of California, Oakland, CA (US)

( * ) Notice: Subject to any disclaimer, the term of this patent is extended or adjusted under 35 U.S.C. 154(b) by 38 days.

(21) Appl. No.: 12/261,822

(22) Filed: Oct. 30, 2008

(65) Prior Publication Data

US 2009/0129139 A1 May 21, 2009

Related U.S. Application Data

(63) Continuation of application No. PCT/US2007/067812, filed on Apr. 30, 2007.

(60) Provisional application No. 60/796,993, filed on May 1, 2006.

(51) Int. Cl.
*G11C 7/00* (2006.01)

(52) U.S. Cl. .................. 365/215; 365/189.05

(58) Field of Classification Search .............. 365/215, 365/189.05
See application file for complete search history.

(56) References Cited

U.S. PATENT DOCUMENTS 6,373,771 B1 * 4/2002 Fifield et al. ............ 365/225.7
6,990,009 B2 1/2006 Bertin et al.
7,176,716 B2 * 2/2007 Madurawe ............... 326/38
7,205,589 B2 * 4/2007 Madurawe ............... 257/209
7,208,976 B2 * 4/2007 Madurawe ............... 326/38
7,239,175 B2 * 7/2007 Madurawe ............... 326/38
7,285,984 B2 * 10/2007 Madurawe ............... 326/38
7,336,097 B2 * 2/2008 Madurawe ............... 326/38
7,466,163 B2 * 12/2008 Madurawe ............... 326/38

* cited by examiner

*Primary Examiner*—Michael T Tran
(74) *Attorney, Agent, or Firm*—John P. O'Banion

(57) ABSTRACT

A scalable nano-electro-mechanical memory cell design that requires only conventional semiconductor fabrication materials and surface micromachining technology, and is suited for use in cross-point memory arrays for very high density non-volatile storage. This design also leverages well established surface-micromachining technology and electro-mechanical device phenomena to achieve an elegantly simple and scalable memory cell structure that can potentially operate with low voltage. An elongate beam is held between a non-deflected state and a deflected state, or between two deflected states, therein defining two binary memory states. Stiction, buried charge layers, or a combination of stiction and buried charge layers can be incorporated to modify the stability of one or both deflected states for the cell. Current through the moveable portion of the elongate beam within the memory cell can be registered utilizing one or more access transistors for reading the data state.

28 Claims, 22 Drawing Sheets

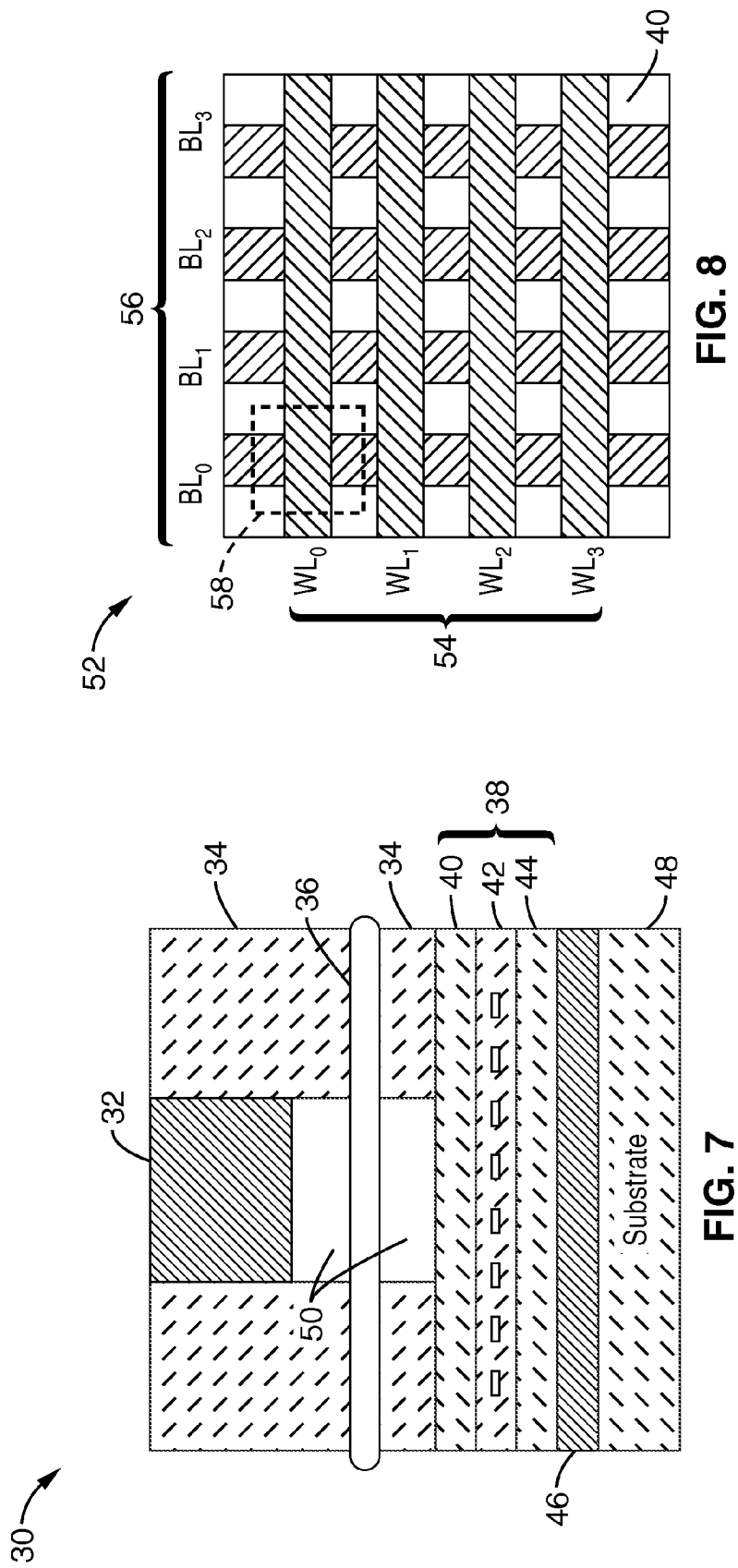

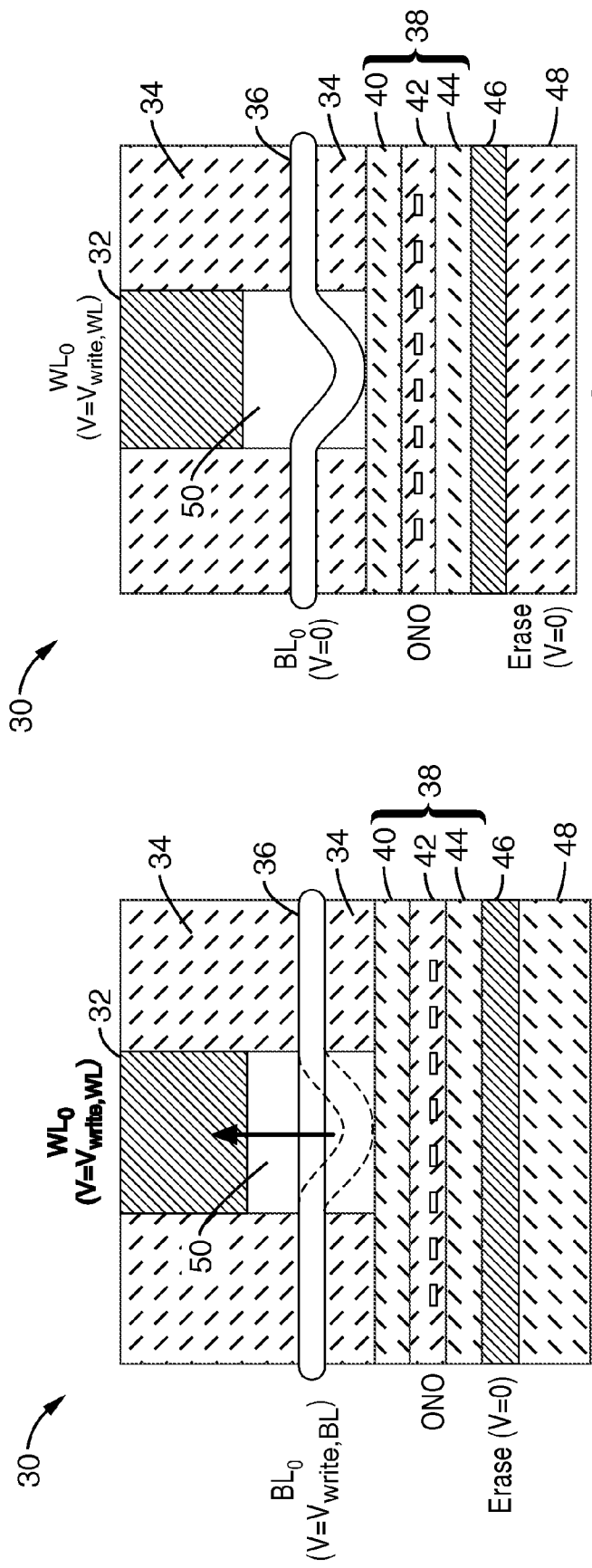

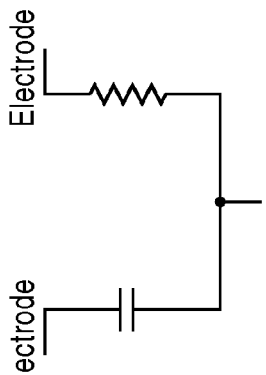
FIG. 38
FIG. 37
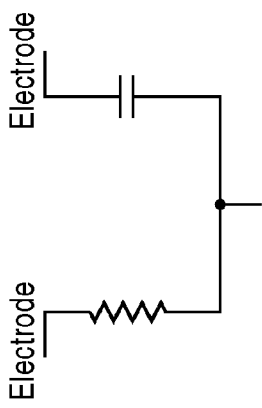
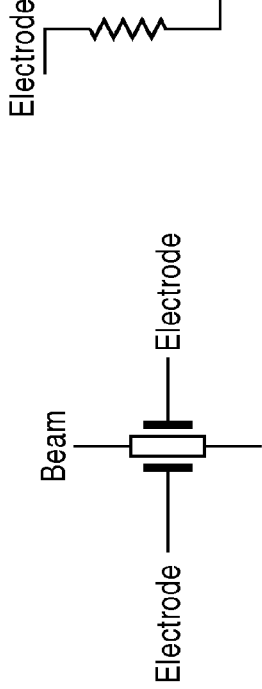
FIG. 36
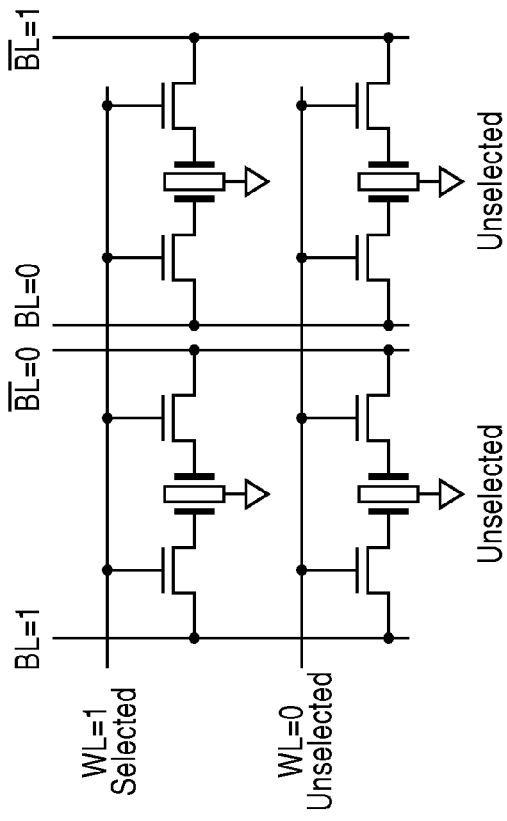
FIG. 40
FIG. 39

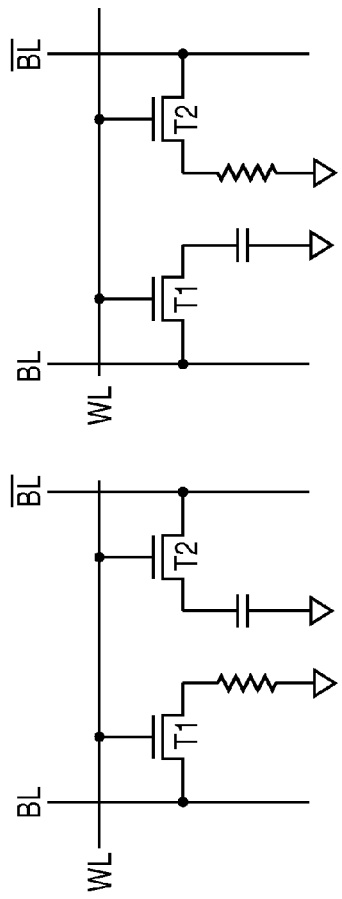
FIG. 41
FIG. 42
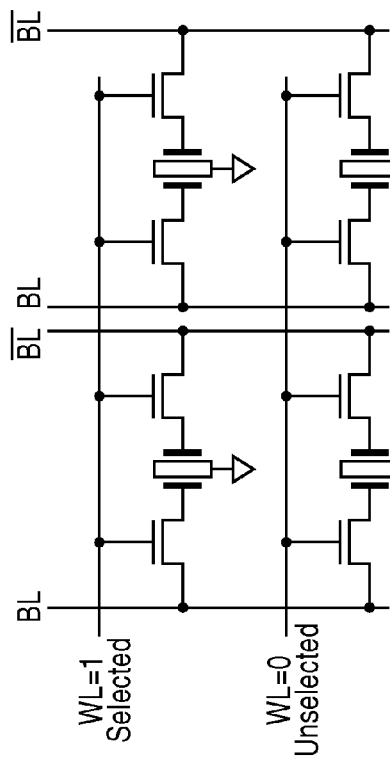
FIG. 43
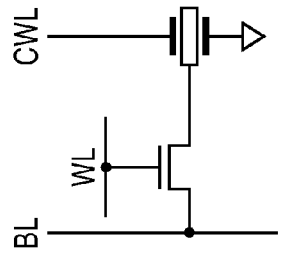
FIG. 45
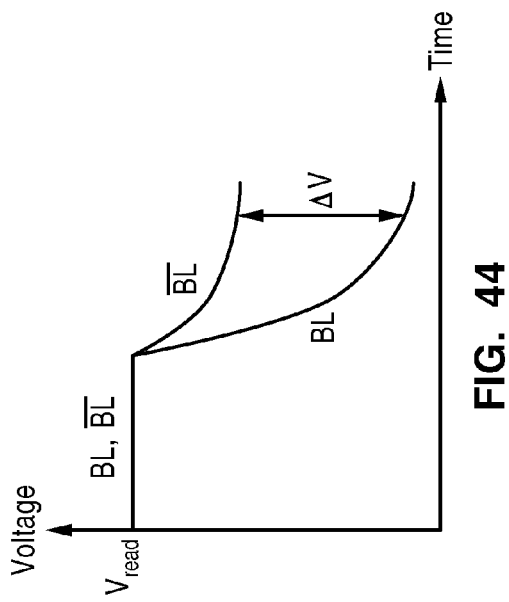
FIG. 44

NANO-ELECTRO-MECHANICAL MEMORY CELLS AND DEVICES

CROSS-REFERENCE TO RELATED APPLICATIONS

This application claims priority from, and is a 35 U.S.C. §111 (a) continuation of, co-pending PCT international application serial number PCT/US2007/067812, filed on Apr. 30, 2007, incorporated herein by reference in its entirety, which claims priority from U.S. provisional application Ser. No. 60/796,993 filed on May 1, 2006, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

A portion of the material in this patent document is also subject to protection under the maskwork registration laws of the United States and of other countries. The owner of the maskwork rights has no objection to the facsimile reproduction by anyone of the patent document or the patent disclosure, as it appears in the United States Patent and Trademark Office publicly available file or records, but otherwise reserves all maskwork rights whatsoever. The maskwork owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to memory cells, and more particularly to nano-electro-mechanical memory cells.

2. Description of Related Art

Non-volatile memory, such as FLASH, is the fastest growing segment of the semiconductor memory market, due to burgeoning demand for highly functional mobile consumer electronics, including cellular phones, digital cameras, camcorders, personal digital assistants, MP3 players, and so forth. The traditional floating-gate FLASH memory cell as shown in FIG. 1, faces significant challenges in being scaled to gate lengths below 100 nm, or worse yet below 10 nm, in view of its thick gate-stack equivalent oxide thickness (EOT).

This scalability issue has been partially assuaged by employing a high-permittivity dielectric (e.g., $SiN_x$ or $HfO_2$) charge-storage layer thus allowing a thinner tunnel dielectric to be employed, and/or a thin-body transistor structure such as the double-gate FinFET thus providing improved suppression of short-channel effects, particularly drain-induced barrier lowering. For this reason, FinFET SONOS (Silicon-Oxide-Nitride-Oxide-Silicon) FLASH memory devices recently have been pursued by the industry, showing promise for scaling to gate lengths of less than 50 nm.

Floating-gate and SONOS-type memory cell designs require high program/erase voltages (e.g., greater than 10V) and are relatively slow to program (e.g., greater 10 μs write time), due to the requirement of a thick (greater than 2 nm) tunnel dielectric to ensure a long retention time, such as a ten year retention time. These characteristics pose a challenge for reducing power consumption and cost, which is particularly important for portable electronics applications. Thus, alternative memory cell designs which allow very high storage density with low voltage operation are desirable, to meet future data storage requirements.

In order to achieve very high storage density rivaling that of hard-disk drives, a memory technology should be stackable; that is, allow for multiple layers of storage cells to be fabricated over CMOS circuitry at reasonable cost. The non-volatile memory technology illustrated in FIG. 2 is an example of a stackable technology; however, it is not re-programmable as the memory structure is based on anti-fuse storage elements in each cell.

Stackable non-volatile memory technologies that are reprogrammable, such as resistive RAM technologies (e.g., magneto-resistive RAM (MRAM), organic RAM, and phase change memory), are being investigated for ultra-high-density non-volatile data storage applications. These have performance characteristics that are superior to FLASH memory technology, for example high endurance (e.g., up to $10^{15}$ write/erase cycles), sub-100 nS read and write speeds, and low operating voltage (e.g., less than 5 Volts).

Among the emerging memory technologies, the front-runners are MRAM and ferroelectric RAM (FeRAM). However, a significant drawback to these technologies is their reliance on non-standard materials which increase process complexity and hence cost. Furthermore, these technologies require a selection device (e.g., a diode or a transistor) within each cell to ensure reasonable sense margins and to prevent data disturbances. The fabrication of stackable selection devices with good performance and uniformity presents significant technological challenges.

Within the next few years MOSFET gate lengths and operating voltages are expected to be scaled down to below 10 nm and below 1 Volt operating levels, respectively. It will be recognized that FLASH memory transistors are more difficult to scale because of the thick gate-stack equivalent oxide thickness (EOT) required in order to meet charge storage (threshold voltage shift) and retention requirements. Although advanced transistor structures can be leveraged to improve gate-length scalability, high program/erase voltages are still required for fast operation. Thus, alternative integrated-circuit memory technologies, such as magnetic RAM (MRAM) and phase-change memory (PCM), have been heavily investigated in recent years. These alternative memory technologies require new materials, which increase process complexity and hence cost, while their scalability to sub-10 nm cell size is not assured. In view of this a need exists for a new non-volatile memory technology that is scalable (in size and operating voltage) in a similar manner as logic devices.

In addition, 3-D stackable memory technologies such as resistive RAM (RRAM) are being investigated for ultra-high density non-volatile data storage applications. As was the case with FeRAM described above, this technology also requires non-standard materials and the use of selection devices within each cell to ensure reasonable sense margins and to prevent data disturbances.

Development is proceeding directed at carbon nanotubes with state value set in response to adhesion between two nanotubes (e.g., NEMS-based memory). In principle, this NEMS-based technology can achieve high density due to the very small diameter of nanotubes; however, methods for precisely and economically growing/placing nanotubes in a regular array have yet to be developed. Furthermore, similar to other RRAM technologies, NRAM suffers from the leakage problem (from other cells along the same bit-line) during read operation and hence requires a selection device within each cell.

Accordingly, a need exists for an apparatus and method of 3-D stackable selection devices with sufficient performance, uniformity and suitability for mass fabrication. These needs and others are met within the present invention which utilizes conventional integrated-circuit materials to overcome the deficiencies of previously developed non-volatile memory technologies.

BRIEF SUMMARY OF THE INVENTION

A simple, scalable nano-electro-mechanical memory cell design is described which can be fabricated using conventional MOS materials and surface micromachining technology, while being particularly well-suited for use in very high density cross-point memory arrays for non-volatile storage. The embodiments leverage well established surface-micromachining technology and electro-mechanical device phenomena to achieve an elegantly simple and scalable memory cell structure that can potentially operate with low voltage levels.

Data state for the memory cell is established in response to the position of a mechanical beam, a portion of which is effected toward assuming one of at least two positions. The bulk of these teachings are directed at a preferred implementation having a bi-stable (binary) state configuration, wherein two positions for the beam are discussed (e.g., deflected or non-deflected, or two deflected positions). However, it should be appreciated that the teachings can be extended to provide for any desired number of stable states within a given cell. The mechanical beam is retained, or anchored, on at least one end and movement of a portion of the beam is effected in response to electrostatic forces, such as applied from a combination of electrodes and charge trapping regions.

The mechanical beam and electrostatic force application means can be embodied within any desired access circuits, such as 1T and 2T transistor configurations similar to those utilized with memory utilizing latches or charge storage for retaining data state.

The invention is amenable to being embodied in a number of ways, including but not limited to the following descriptions.

At least one embodiment of the invention provides a nano-electro-mechanical memory cell, comprising: (a) at least one electrode within a nano-electro-mechanical memory cell; (b) a mechanical beam having a portion configured for deflection toward at least one said electrode, said deflection arising in response to electrostatic force applied between said beam and at least one said electrode; and (c) means for determining a data state for said nano-electro-mechanical memory cell in response to the positioning of said portion of said mechanical beam. Two positions of the mechanical beam define two data states, such as a non-deflected state and a deflected state, or two deflected states (e.g., in different, or more preferably opposing, directions). In at least one implementation, the memory cell is adapted for overcoming the spring restoring force of the mechanical beam (in its deflected state), in response to generation of a holding force. The holding force can be generated in a number of different ways or combination of ways depending on the desired memory cell characteristics. For example, the holding force can comprise: (i) an electrostatic force created between an electrode (e.g., at least one) and the mechanical beam, or created from electrostatic force between a buried charge layer (e.g., at least one) and the mechanical beam, or a combination of electrostatic force from at least one electrode and at least one buried charge layer; or (ii) stiction forces created from the interface between the mechanical beam in a deflected state and a surface upon which it makes contact; or (iii) a combination of electrostatic forces and stiction forces.

Another embodiment of the invention can provide a nano-electro-mechanical memory cell, comprising: (a) at least two electrodes within a nano-electro-mechanical memory cell; (b) a mechanical beam having at least a portion which is moveable between each of the at least two electrodes in response to electrostatic force (e.g., combination of fields from electrode voltages and charge trapping layers), such as applied between the beam and at least one of the electrodes; and (c) means for determining a data state for the nano-electro-mechanical memory cell in response to the positioning of at least a portion of the mechanical beam. In at least one embodiment the data state is determined in response to the position of the mechanical beam subject to stiction contact with either of at least two electrodes, or in stiction contact with surfaces adjacent either of at least two electrodes (e.g., surface may comprise one or more dielectric, or other coating layers, over the electrode). The means for determining data state may comprise any desired sense circuit, such as at least one transistor coupled to the mechanical beam and configured for detecting the position of the mechanical beam in response to detection of electrical characteristics, such as current flow.

Another embodiment of the invention can provide a nano-electro-mechanical memory cell, comprising: (a) a first electrode within a nano-electro-mechanical memory cell; (b) a second electrode separated by a gap from the first electrode; and (c) a mechanical beam, a portion of the mechanical beam positioned in the gap; (d) wherein the mechanical beam is moveable between a position where the beam is in proximity (e.g., adjacent or in contact) with the first electrode and a position where the beam is in proximity (e.g., adjacent or in contact) with the second electrode; (e) wherein movement of the beam is effected by electrostatic force between the beam and at least one of the electrodes (and/or charge trapping layers); and (f) wherein data states of the nano-electro-mechanical memory cell are determined in response to detecting positioning for the portion of the mechanical beam which defines the memory state.

Another embodiment of the invention can provide a nano-electro-mechanical memory cell, comprising: (a) a first electrode within a nano-electro-mechanical memory cell; (b) a second electrode separated by a gap from the first electrode; and (c) a mechanical beam, a portion of the mechanical beam positioned in the gap (e.g., anchored on at least one end); (d) wherein the mechanical beam is moveable between a position where the beam is in contact with (or proximal to) the first electrode and a position where the beam is in contact with (or proximal to) a dielectric material on the second electrode; (d) wherein movement of the beam is effected (actuated) by electrostatic force between the beam and at least one of the electrodes; and (e) wherein data states of the nano-electromechanical memory cell are determined in response to detecting the positioning of the portion of the mechanical beam. In one preferred embodiment, the dielectric material (e.g., oxide-nitride-oxide (ONO) stack) is configured for charge trapping and the memory cell is non-volatile as the beam is positioned stably in either of two states. In at least one embodiment, the dielectric material is not configured for charge trapping and the memory cell is volatile.

In the above embodiments the electrostatic force is generated by applying a voltage between the beam and the electrode (and/or charge-trapping layer). In at least one embodiment, access to the memory cell is provided by coupling at least one access transistor to the beam for programming and reading cell state. In at least one embodiment, access to the memory cell is provided by coupling at least one transistor to each end of the mechanical beam for programming and reading cell state. In a preferred embodiment, the memory cell has two stable data states determined in response to the position of the mechanical beam, which are preferably established by stiction of a portion of the mechanical beam to the first electrode or the second electrode, or to a surface (e.g., one or more coating or adjacent layer) proximal the first electrode or the second electrode, wherein changing the state of the memory cell requires overcoming these stiction forces in response to a sufficient electrostatic force (e.g., between the beam and combination of electrodes and charge trapping layers).

Another embodiment of the invention can provide a nano-electro-mechanical memory cell, comprising: (a) a first electrode (e.g., a word-line) within a nano-electro-mechanical memory cell; (b) a second electrode (e.g., an erase line or second word-line) separated by a gap from the first electrode; (c) a mechanical beam (e.g., a bit-line), a portion of the mechanical beam positioned in the gap between the first and second electrodes; and (d) a dielectric stack (e.g., optionally configured for charge trapping within an oxide-nitride-oxide (ONO) stack) positioned between the mechanical beam and the second electrode; (e) wherein the mechanical beam is moveable between an undeflected position, and a deflected position where the beam is proximal the dielectric stack; and (f) wherein deflection of the beam is in response to a sufficient electrostatic force applied between the beam and said second electrode and/or charge-trapping layer; (g) wherein data states of the nano-electromechanical memory cell are determined in response to detecting the positioning of a portion of the mechanical beam. In at least one implementation, the beam is coupled to a memory bit-line, such as through a transistor for accessing the memory cell. It should be appreciated that when a charge trapping layer is utilized within, or in place of, an electrode it operates to increase or decrease the resultant electrostatic force applied between the beam and at least one of the electrodes. In at least one implementation, the electrostatic force between the beam and said first electrode can be used to detect the positioning of a portion of the mechanical beam.

Another embodiment of the invention can provide a nano-electro-mechanical memory cell, comprising: (a) a first electrode within a nano-electro-mechanical memory cell; (b) a second electrode separated by a gap from the first electrode; and (c) a mechanical beam, a portion of the mechanical beam positioned in the gap between the first and second electrodes; (d) wherein the mechanical beam is moveable between a position where the beam is in stiction contact with a surface proximal the first electrode and a position where the beam is in stiction contact with a surface proximal the second electrode; (e) wherein movement of the mechanical beam is induced in response to the application of a sufficient electrostatic force between the mechanical beam and at least one of the electrodes to overcome stiction forces associated with the stiction contact; and (f) wherein detection of current flow through the bit-line in response to the position of the portion of the mechanical beam determines the state of the memory cell during a read operation.

Another embodiment of the invention can provide a method of registering data states within a nano-electro-mechanical memory cell, comprising: (a) fabricating at least first and second electrode regions separated by a gap; (b) anchoring an elongated beam having at least one moveable portion of the elongated beam disposed within the gap; (c) writing the memory cell by applying a sufficient electrostatic potential between the elongated beam and the first or second electrode region to displace the portion of the elongated beam into stiction contact with the first or second electrode region; and (d) reading the memory cell state by detecting the level of current passing through the elongated beam to determine if the moveable portion of the beam is in stiction contact with the first or second electrode region, thereby detecting whether the memory cell is retaining a data "1" or a data "0".

The present invention can provide a number of beneficial aspects which can be implemented either separately or in any desired combination without departing from the present teachings.

An aspect of the invention is to provide a memory cell technology which overcomes the tradeoffs associated with conventional memory solutions.

Another aspect of the invention is to provide a memory cell technology which is non-volatile.

Another aspect of the invention is to provide a memory cell technology which is reprogrammable.

Another aspect of the invention is to provide a memory cell technology which has no need for refreshing memory cells, and thus no need of refresh circuitry.

Another aspect of the invention is to provide a memory cell technology in which the data state is readily discerned by a simple sense amplifier providing high noise margins.

Another aspect of the invention is to provide a memory cell technology in which memory cell states can be read or written without disrupting the states of nearby memory cells.

Another aspect of the invention is to provide a memory cell technology which can be implemented with readily available materials having known properties.

Another aspect of the invention is to provide a memory cell technology which is suitable for use in a cross-point memory architecture.

Another aspect of the invention is to provide a memory cell technology which is well-suited as a universal memory type in a number of applications.

Another aspect of the invention is to provide a memory cell technology which is suitable for replacing multiple current memory types, such as FLASH, SRAM, DRAM and so forth.

Another aspect of the invention is to provide a memory cell technology which can provide a high data retention duration, such as exceeding ten years.

Another aspect of the invention is to provide a memory cell technology which is subject to very low quiescent current draw, and more particularly can be implemented so that no current is drawn in quiescent state.

Another aspect of the invention is to provide a memory cell technology which is scalable toward or below 10 nm.

Another aspect of the invention is to provide a memory cell technology which can be implemented with conventional memory read and write transistor configurations (i.e., 1T and 2T configurations and so forth).

Another aspect of the invention is to provide a memory cell technology in which fabrication can be performed utilizing conventional techniques.

Another aspect of the invention is to provide a memory cell technology in which the bi-stable mechanical beam is stackable (i.e., over or under) with respect to the transistor access circuits.

Another aspect of the invention is to provide a memory cell technology which is suitable for low-cost high-volume fabrication.

Another aspect of the invention is to provide a memory cell technology in which tradeoffs between speed and areal density can be readily made in response to the intended application.

Another aspect of the invention is to provide a memory cell technology which relies on physical state (position) of a singly-anchored or doubly-anchored nano-scale beam in response to an electrostatic field.

Another aspect of the invention is to provide a memory cell technology in which electrostatic forces are utilized to change state of the cell so as to overcome mechanical forces operating on the beam, such as spring forces, deformation forces, and stiction forces.

Another aspect of the invention is to provide a memory cell technology in which mechanical forces operating on the beam can be controlled in response to design and fabrication processes, and in particular changing materials, shapes, textures, structural configuration and so forth to arrive at desired state change characteristics.

Another aspect of the invention is to provide a memory cell technology in which electrostatic forces are utilized to change cell state in response to overcoming mechanical forces as well as electrostatic forces from nearby stored charges, such as resulting from a buried trapping layer adjacent to the physical position of the mechanical beam (i.e., in its deflected state).

Another aspect of the invention is to provide a memory cell technology which utilizes a three-terminal nano-scale beam actuator as a bi-stable state retention device (i.e., mechanical "flip-flop") for use within a variety of electronic devices.

Another aspect of the invention is to provide a memory cell technology in which a nano-scale bi-stable beam is utilized with one and two access transistor circuits for sensing and setting the state of each cell within a memory array.

Another aspect of the invention is to provide a memory cell technology in which bi-stable operation relies on stiction forces exceeding the spring restoring force of the mechanical beam.

Another aspect of the invention is to provide a memory cell technology in which data state changes arise in response to application of a sufficient electrostatic field to overcome stiction of the beam and direct it into a new position, such a new position in which a stiction interface is formed with another surface.

Another aspect of the invention is to provide a memory cell technology in which the mechanical beam can remain in static equilibrium when stuck, such as in response to stiction, to either a first or second electrode and thus store binary information.

Another aspect of the invention is to provide a memory cell technology which beneficially utilizes stiction of the beam to provide non-volatility of data.

Another aspect of the invention is to provide a memory cell technology in which a nano-scale "data state" beam can be oriented in any desired direction, such as oriented vertically or laterally with respect to a laterally-oriented substrate.

Another aspect of the invention is to provide a memory cell technology in which stored information can be detected as current flowing through the beam as detected within a memory bit-line.

Another aspect of the invention is to provide a memory cell technology in which no leakage current path exists along the same bit-line, wherein selection devices are not required within each memory cell.

Another aspect of the invention is to provide a memory cell technology in which the altering of beam pull-in and release voltages in response to charge stored in a dielectric layer provides hysteretic behavior between two data states.

Another aspect of the invention is to provide a memory cell technology in which beam pull-in and release is altered in response to voltage applied to an erase electrode.

Another aspect of the invention is to provide a memory cell technology in which the mechanical system is encapsulated under low-pressure (e.g., evacuated, partially evacuated, or low pressure non-reactive gas) to reduce damping of mechanical beam deflection, and thus increase memory speed.

Another aspect of the invention is to provide a memory cell technology in which the electromechanical memory cells are implemented utilizing word-line and bit-line control signals; or bit-line, read word-line and write word-line control signals; or bit-line, read word-line and control word-line control signals, or similar variations.

Another aspect of the invention is to provide a memory cell technology in which the NEMRAM structures can be utilized as a programmable interconnect fabric, for example providing look-up tables in defect tolerant architectures.

Another aspect of the invention is to provide a memory cell technology in which a combination of semiconductor and metallic materials are utilized in the fabrication of the memory or switching fabric structures.

Further aspects of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 7 is a cross-section of a NEMory cell according to an embodiment of the present invention, wherein charge is stored (trapped) in a portion of a dielectric stack, such as within a nitride layer.

FIG. 8 is a plan view of a 4×4 (16 bit) NEMory array according to an aspect of the present invention, showing that the 16 bits share a common dielectric stack (e.g., ONO-stack) and erase electrode.

FIG. 15 is a cross-section of a memory cell upon which a "1" is written according to an aspect of the present invention.

FIG. 16 is a cross-section of a memory cell upon which a "0" is written according to an aspect of the present invention.

FIG. 36 is a symbol utilized for representing the lateral displacement beam (single or double anchor) according to an aspect of the present invention.

FIG. 37 is a schematic of an equivalent circuit for a NEM-RAM according to an aspect of the present invention, shown modeling the state with left-side beam stiction.

FIG. 38 is a schematic of an equivalent circuit for a NEM-RAM according to an aspect of the present invention, shown modeling the state with right-side beam stiction.

FIG. 39 is a schematic of a NEMRAM cell utilizing a two transistor access configuration according to an aspect of the present invention.

FIG. 40 is a schematic of NEMRAM programming according to an aspect of the present invention.

FIG. 41 is a schematic of an equivalent circuit for a first data state of a NEMRAM according to an aspect of the present invention.

FIG. 42 is a schematic of an equivalent circuit for a second data state of a NEMRAM according to an aspect of the present invention.

FIG. 43 is a schematic of a NEMRAM array according to an aspect of the present invention, showing a read operation.

FIG. 44 is a graph of the change of bit-line voltage for the NEMRAM according to an aspect of the present invention.

FIG. 45 is a schematic of a one transistor NEMRAM cell according to an aspect of the present invention, showing a single-ended access transistor.

DETAILED DESCRIPTION OF THE INVENTION

Referring more specifically to the drawings, for illustrative purposes the present invention is embodied in the apparatus generally shown in FIG. 3 through FIG. 46. It will be appreciated that the apparatus may vary as to configuration and as to details of the parts, and that the method may vary as to the specific steps and sequence, without departing from the basic concepts as disclosed herein.

1. NANO-ELECTRO-MECHANICAL MEMORY (NEMory)

FIG. 3 through FIG. 6 illustrate aspects of a nano-electro-mechanical (NEM) nonvolatile memory cell according to the present invention, which is herein referred to for the sake of brevity as a "NEMory". In this example a portion of the mechanical beam remains undeflected (not stuck down) when representing a data "1" state, or deflected (stuck down) in representing a data "0" state.

Figure 2:
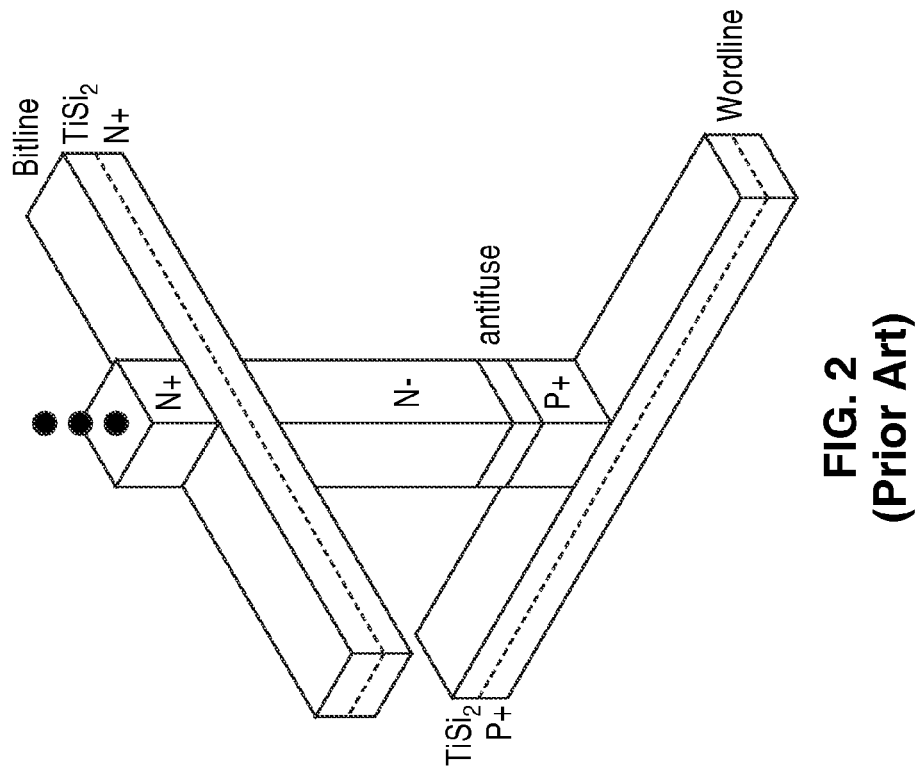
FIG. 2 is a schematic of a conventional stacked, anti-fuse based, memory cell.
Figure 1:
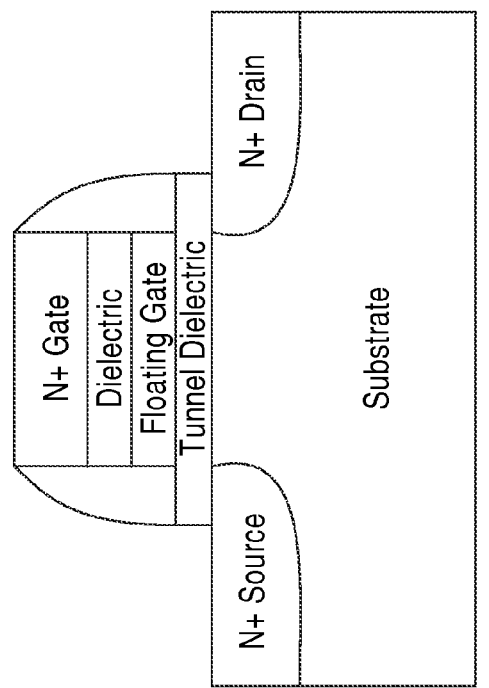
FIG. 1 is a schematic of a conventional floating-gate memory cell.
Figure 4:
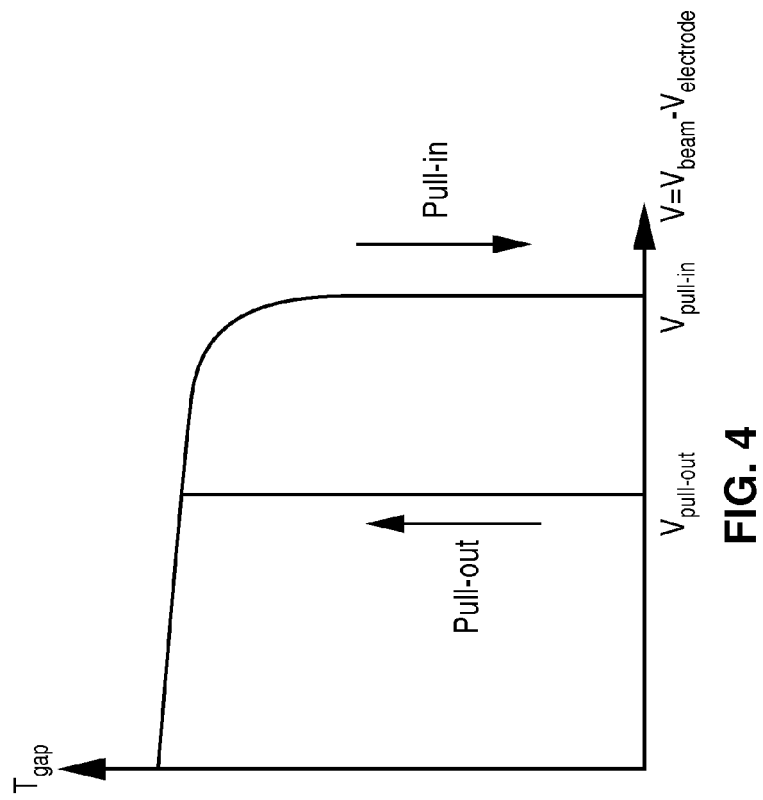
FIG. 4 is a graph of gap distance with respect to pull-in or pull-out voltage for the device of FIG. 3, showing response hysteresis.
Figure 3:
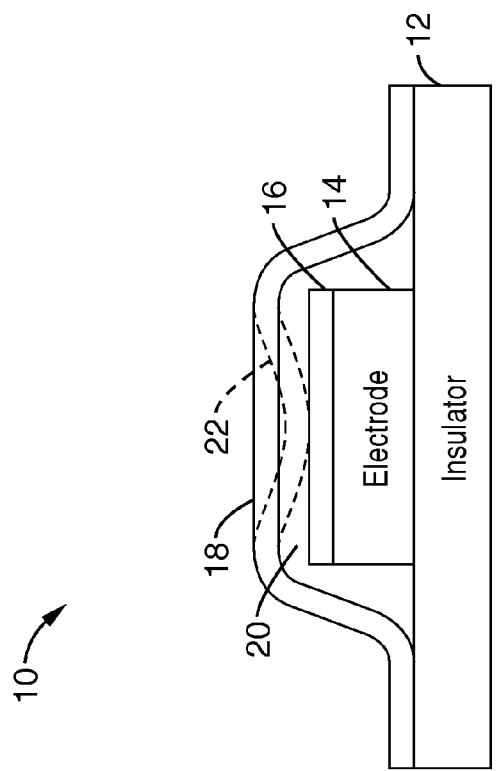
FIG. 3 is a schematic of a gap-closing actuator memory according to an embodiment of the present invention.
Figure 6:
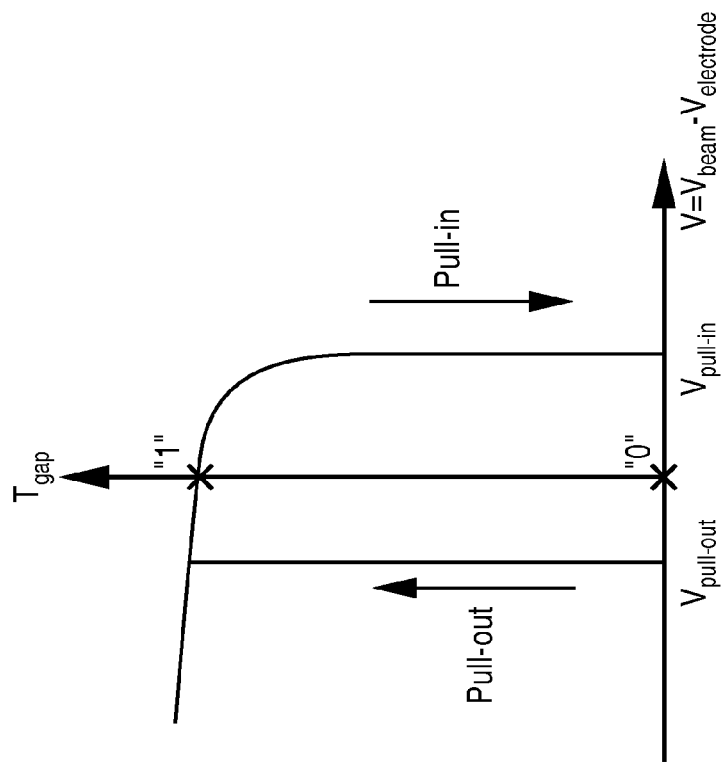
FIG. 6 is a graph of gap distance with respect to pull-in or pull-out voltage for the device of FIG. 5, showing hysteresis shifting in response to the presence of stored charge.

In FIG. 3 a first example embodiment 10 is depicted showing a substrate 12 (e.g., insulator) upon which is retained an electrode 14 with dielectric layer 16. A moveable beam 18 is positioned separated from dielectric 16 by a gap 20. In response to application of a sufficient electrostatic field, such as applying a sufficient voltage excursion ($V > V_{pull-in}$) between beam 18 and electrode 14, beam 18 snaps down toward, or more preferably into contact with, dielectric layer 16. When pulled in, the shape of beam 18 changes to that of deflected beam 22 (shown in phantom). It should be appreciated that a smaller voltage ($V_{pull-out}$) is needed to hold the beam down, which results in hysteretic behavior. It should be noted that the level of exhibited stiction forces for the beam in the "snapped down" position can be controlled in response to changing the type of dielectric material utilized, configuration (i.e., patterning) of its surface and/or that of the underside of the beam, or by altering the extent to which the beam snaps down upon the dielectric. FIG. 4 depicts how the device structure of FIG. 3 exploits the hysteretic behavior of a mechanical gap-closing actuator.

Figure 5:
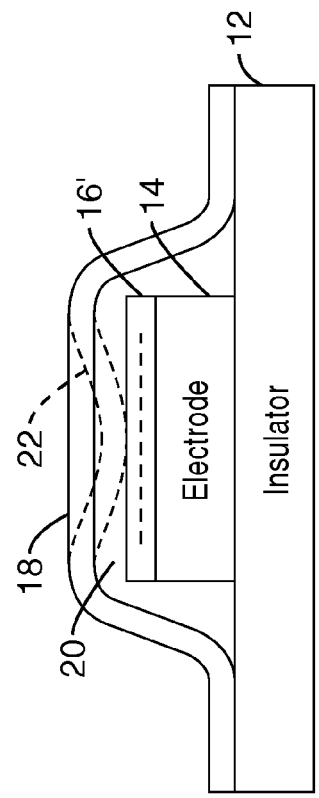
FIG. 5 is a schematic of a gap-closing actuator memory according to an embodiment of the present invention, showing a dielectric having retained charge.

In FIG. 5 a second example embodiment is depicted in which charge can be stored (trapped) in a portion of a dielectric layer 16'. Beam 18 is shown non-deflected before pull-in, and after pull-in as beam 22. In response to the trapped charge, the pull-in and release voltages for the beam will shift as shown by the gap-vs-voltage curve of FIG. 6. Therefore, the charge stored in the underlying dielectric layer can be used to adjust the pull-in and release voltages. If the areal density of the trapped charge is such that $V_{release} < 0V$ and $V_{pull-in} > 0V$, then a bi-stable memory element is achieved.

1.1 NEMory Cell Structure.

Figure 9:
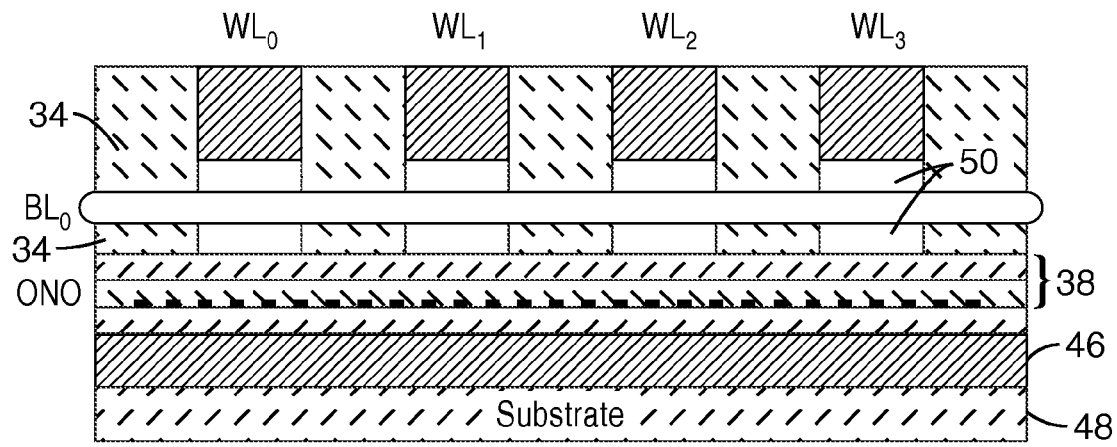
FIG. 9 is a cross-section view of four (4) NEMory cells according to an embodiment of the present invention.

FIG. 7 through FIG. 9 illustrate a nano-electro-mechanical non-volatile memory cell embodiment 30 based upon the aforementioned bi-stable characteristic. In FIG. 7 cell 30 is shown comprising a top electrode 32 (e.g., word-line, WL), an adjacent and/or overlapping anchor structure 34 retain the ends of a mechanical beam 36 (e.g., bit-line, BL) within a gap 50. A dielectric 38, configured in this case with a charge trapping region, is shown over a bottom electrode 46 on substrate 48. By way of example and not limitation, dielectric 38 is adapted for charge trapping by utilizing an oxide-nitride-oxide (ONO) stack having first oxide layer 40, first nitride layer 42, and second oxide layer 44, or similar configurations which provides charge trapping within the dielectric. Bottom electrode 46 forms a common erase electrode (e.g., planar) which is shown by way of example coupled to substrate 48. Gap 50 (e.g., vacuum gap) is shown between beam 36 and electrode 32 and the charged dielectric 38. The mechanical beam 36, being of a conductive material, forms a bit-line which passes a series of read and write word-lines. The bit-lines are utilized to store and read out state information from the memory cell, wherein the beam is often referred to herein as a bit-line.

It should be appreciated that the NEMory cell above, though shown configured with charge trapping on the bottom electrode, can be implemented with charge trapping for either electrode, or both electrodes (e.g., with the same or different levels of charge trapping) according to different memory applications.

According to one implementation, the NEMory cell is fabricated from metallic material(s), for example titanium nitride and amorphous aluminum alloy toward minimizing surface forces and achieving high endurance, respectively. Conventional low-temperature-deposited dielectric material(s) can be utilized to electrically isolate the electrodes and mechanically anchor the ends of the mechanical beam. The gaps are preferably formed to release a sufficient portion of the beam to allow for deflection, for example by selectively etching away sacrificial material from the anchor region, such as germanium which can be deposited by conventional low-pressure chemical vapor deposition at temperatures below 350° C. and selectively removed in hydrogen peroxide solution or with a dry-etch process.

FIG. 8 illustrates a NEMory array 52 in plan view with a plurality of word-lines 54 ($WL_0$, $WL_1$, $WL_2$, $WL_3$), and a plurality of bit-lines 56 ($BL_0$, $BL_1$, $BL_2$, $BL_3$), at the interposition of each of which a bit 58 of memory is retained.

FIG. 9 illustrates a cross section of the memory array of FIG. 8. It should be appreciated that the bits of memory in the array share a common ONO-stack and erase electrode.

1.2 Read Operation.

Figure 10:
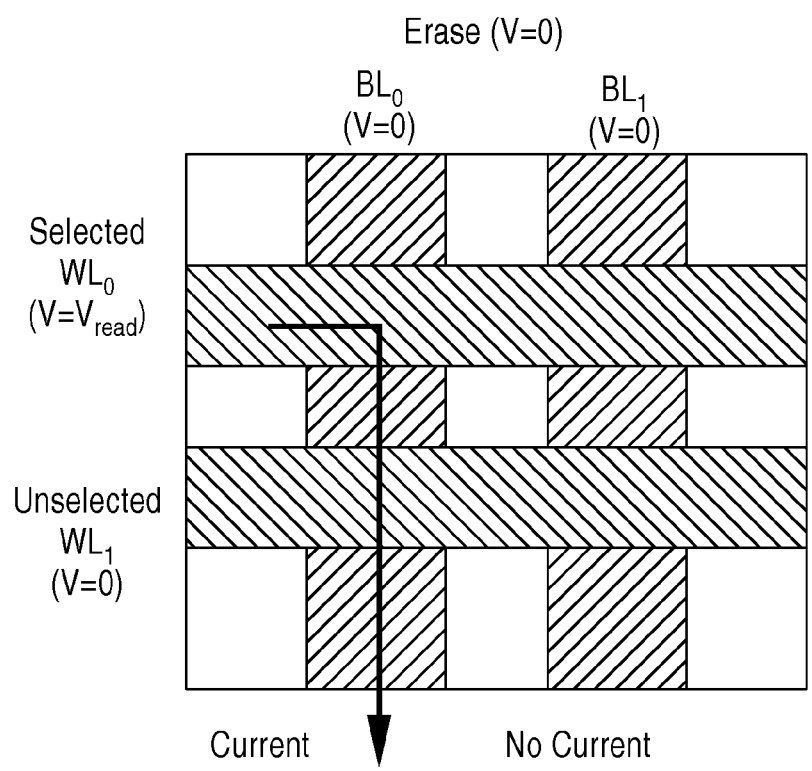
FIG. 10 is a plan view of a bias scheme for reading memory cells according to an aspect of the present invention, showing word-lines and bit-lines.
Figure 12:
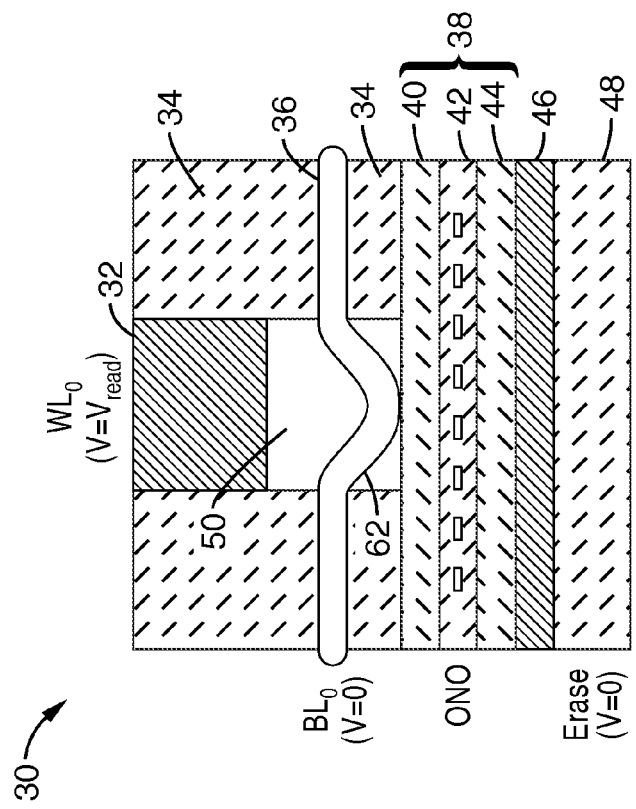
FIG. 12 is a cross-section of a memory cell retaining a "0" being read according to an aspect of the present invention.
Figure 11:
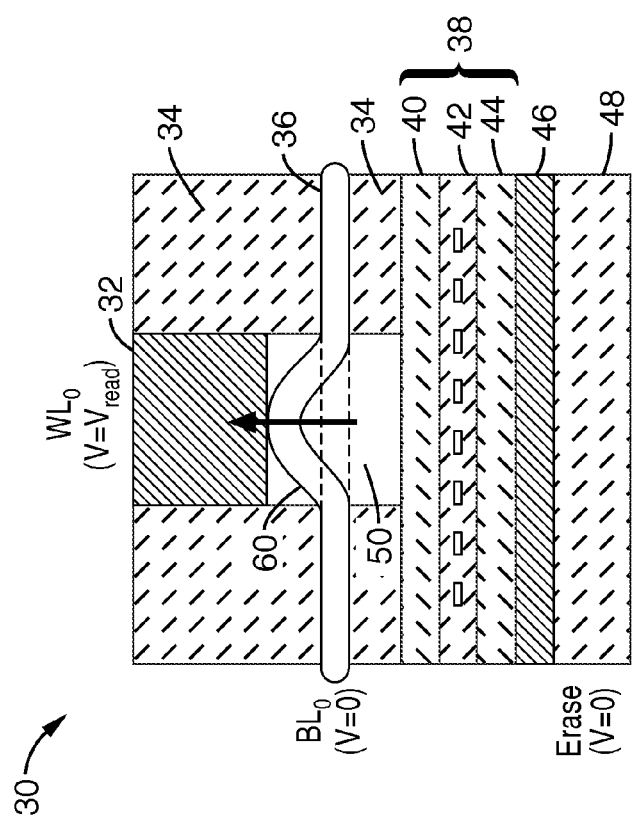
FIG. 11 is a cross-section of a memory cell retaining a "1" being read according to an aspect of the present invention.

FIG. 10 through FIG. 12 illustrate a read process for the NEMory cell shown in FIG. 7, which is shown by way of example in a small 2×2 array. To read the state of the cell, a positive bias $V_{read}$ is applied to the word-line (WL) as shown in FIG. 10, while other word-lines, bit-lines and the erase electrode of the array (or portion of the array) are grounded. The electrostatic force is of sufficient intensity (high) to cause the word-line to contact the bit-line if the cell is in the "1" (not stuck-down) state 60 as shown in FIG. 11. However, deflection to the word-line will not arise if the cell is in the "0" (stuck-down) state 62 as shown in FIG. 12. A means for detecting beam positioning determines electrical characteristic of the beam to differentiate binary states of the memory cell, preferably detecting bit-line current (BL) as an indicator of beam position. It should be appreciated that unlike other cross-point memory cell designs, no leakage current paths exist, wherein the current difference detected between the "1" and the "0" states are very significant.

1.3 Programming Operation.

Figure 13:
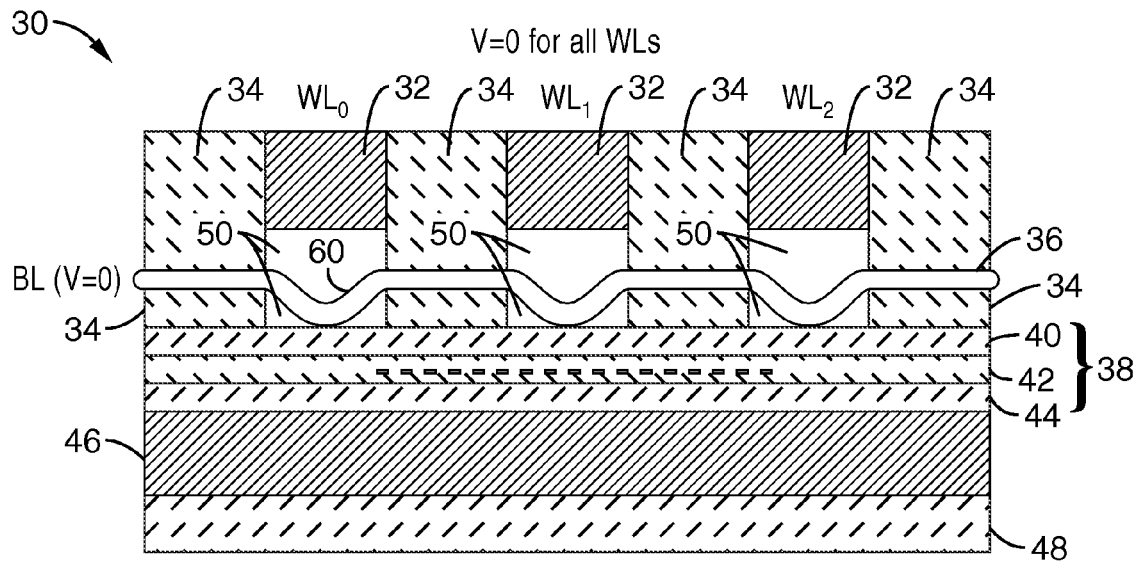
FIG. 13 is a cross-section of multiple memory cells being erased according to an aspect of the present invention.

FIG. 13 illustrates an example embodiment 30 shown with a negative bias $V_{erase}$ applied to erase electrode 46 to cause the bit-line to be stuck down to the dielectric layer within each cell for erasing cells within a memory block to a "0" state.

Figure 14:
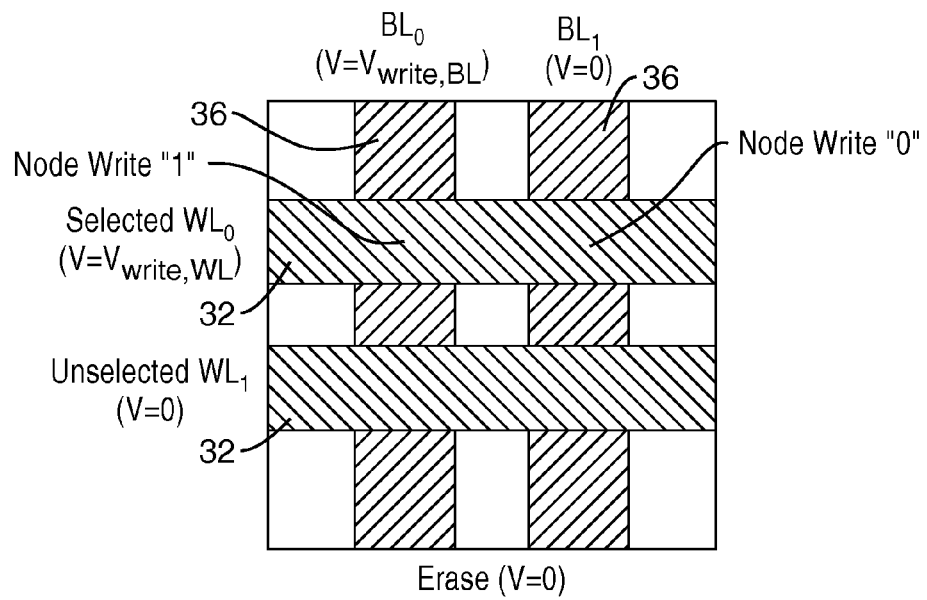
FIG. 14 is a plan view of a write operation performed on one word-line at a time according to an aspect of the present invention.

FIG. 14 through FIG. 16 illustrate that a write operation can be executed one word-line at a time as follows. FIG. 14 illustrates a positive write voltage $V_{write, WL}$ which is applied to selected word-line ($WL_0$) 32, wherein a "1" is written at a first node in response to the negative voltage $V_{write, BL}$ bias applied at bit-line ($BL_0$) 36 to generate a sufficient electrostatic attractive force between word-line 32 and bit-line 36 to separate bit-line from the gate dielectric 40. FIG. 15 illustrates beam 36 being restored in response to this write operation. At a second node of FIG. 14, a "0" is written on the same word-line ($WL_0$) 32 by grounding bit-line ($BL_1$) 36, the result being shown in FIG. 16. Memory cells along unselected word-lines (e.g., $WL_1$) and bit-lines are not disturbed.

In one embodiment of the invention, the amount of charge stored in the underlying dielectric is constant, which is in contrast to how trapped charge is used within a FLASH memory device. By way of example, it will be appreciated that this charge can be introduced by ion-implantation during the fabrication process, or by Fowler-Nordheim tunneling as an initial set operation, or by any other desired mechanism without departing from the teachings of the present invention. Thus, dielectric reliability and retention should not be an issue for NEMory technology.

2. DETAILS OF NEMORY CELL STRUCTURE AND ARRAY ARCHITECTURE

Figure 17:
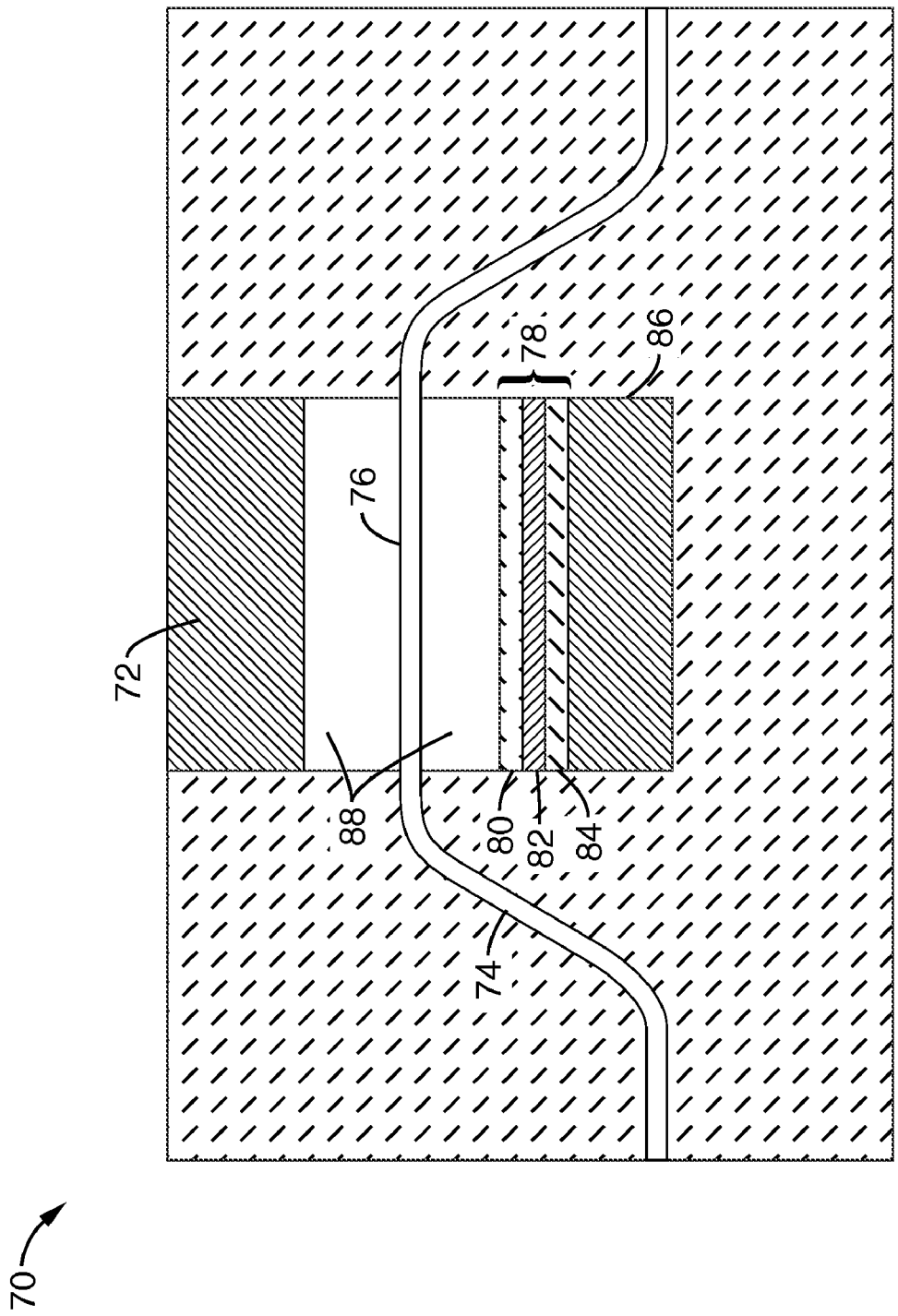
FIG. 17 is a cross-section of another example NEM memory architecture according to an embodiment of the present invention.

FIG. 17 illustrates an example embodiment 70 of an alternative embodiment of the NEMory cell design, utilizing separate write word-lines, rather than a single (i.e., planar) erase electrode. A first word-line (i.e., read) 72 is shown over a moveable portion 76 of a mechanical beam along a bit-line 74. A dielectric stack 78 is shown, by way of example containing ONO layers 80, 82, 84. A bottom electrode 86 comprises a second word-line (i.e., write). Gaps 88 are shown above and below bit-line 74.

Figure 19:
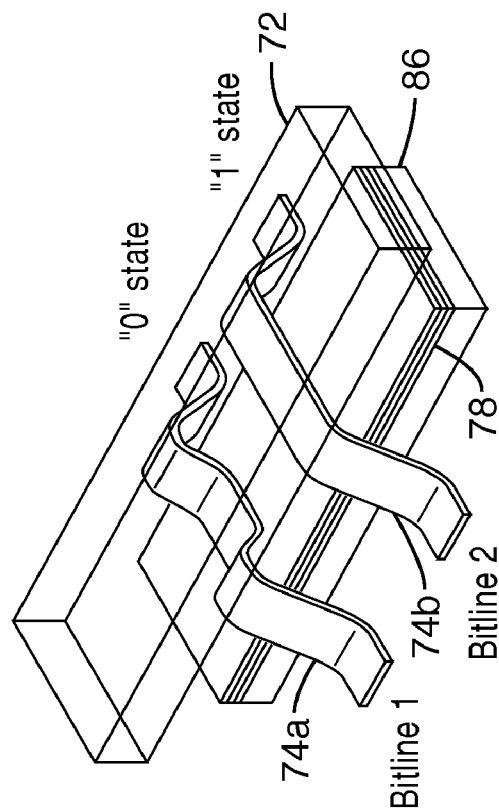
FIG. 19 is a perspective view of the memory architecture of FIG. 17 according to an aspect of the present invention, showing a first cell in the "0" state and a second cell in a "1" state.
Figure 18:
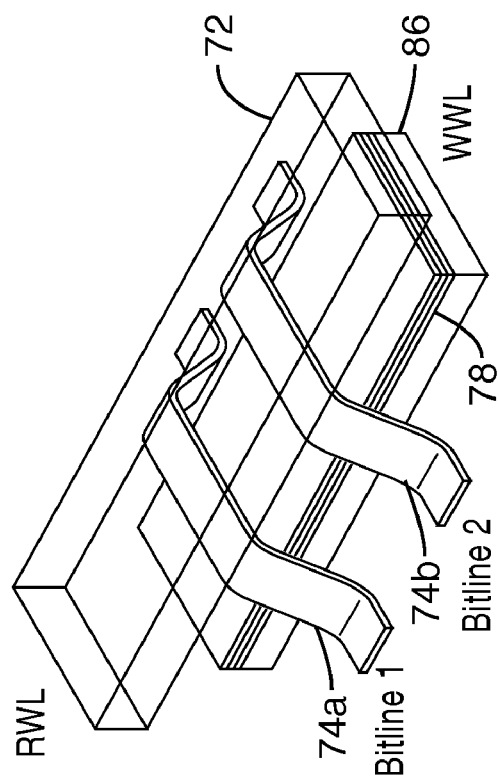
FIG. 18 is a perspective view of the memory architecture of FIG. 17 according to an aspect of the present invention, showing two memory cells on the same word lines.

FIG. 18 through FIG. 19 illustrate two cells of the embodiment of FIG. 17 shown on the same first and second word-lines, which are utilized here, respectively, as the read word-line and write word-line. In FIG. 18 the position of two mechanical beam elements along separate bit-lines are in the "1" state, while in FIG. 19 bit-line_1 74a is in a "0" state and bit-line 2 74b is in the "1" state. It is readily seen that in this embodiment the information is stored in response to the physical state (position) of moveable portion 76 of the mechanical beam along bit-line 74a, 74b, wherein a "0" is stored if this portion of the bit-line is stuck down to the underlying dielectric (i.e., activated), while a "1" is stored if this portion of the bit-line is not stuck down (i.e., it is released).

Figure 20:
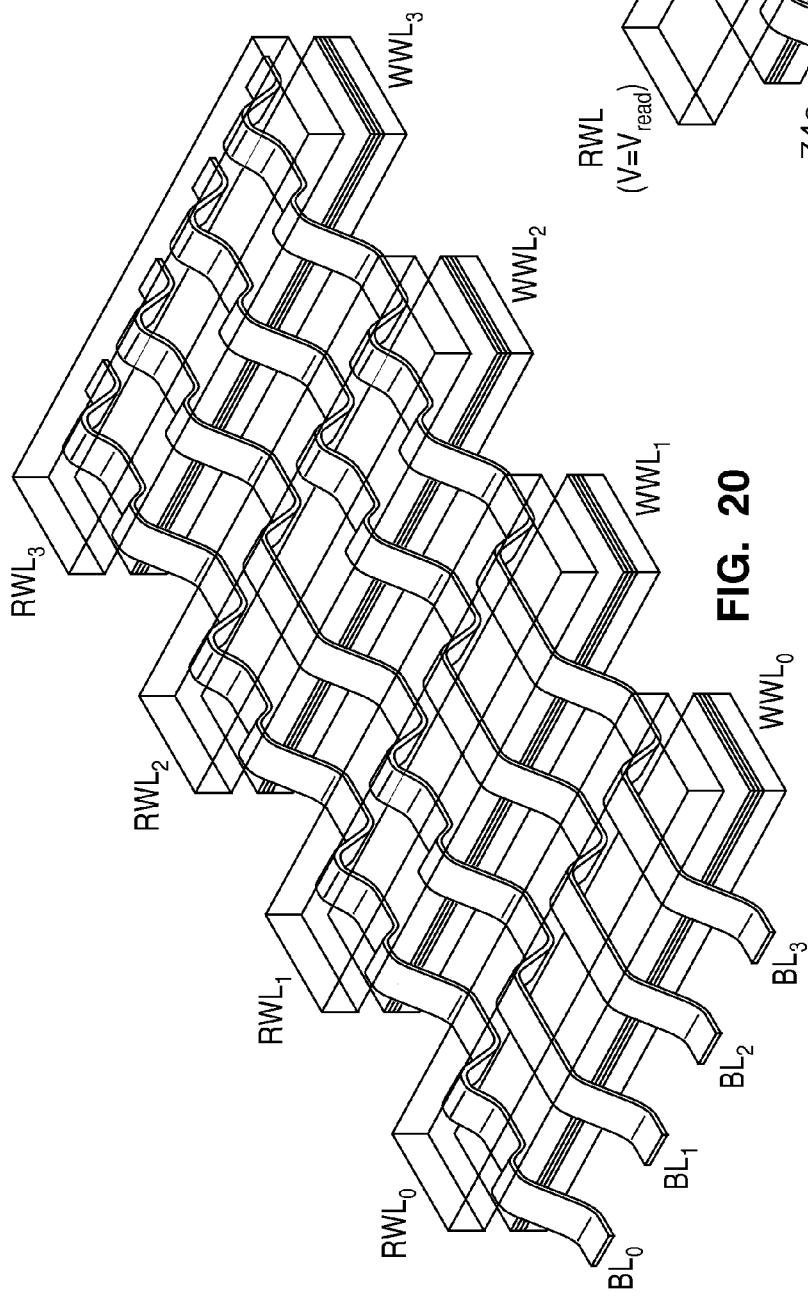
FIG. 20 is a perspective view of a plurality of memory cells according to an embodiment of the present invention.

FIG. 20 illustrates a plurality of word-lines within a cross-point array architecture to provide high-density storage. By way of example, and not limitation, a 4×4 matrix of cells is shown spanning four word-lines (0-3), and four bit-lines (0-3).

2.1 Read Operation.

Figure 21:
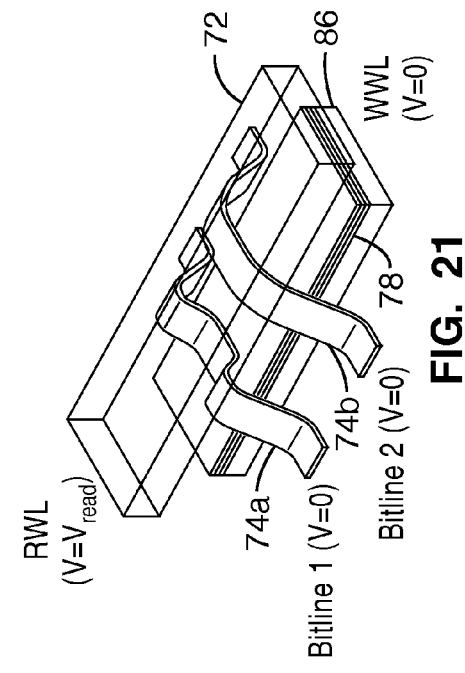
FIG. 21 is a perspective view of reading memory cells of a NEMory according to an embodiment of the present invention.

FIG. 21 illustrates an example of reading information from a NEMory cell by applying a positive bias $V_{read}$ to the read word-line 72 (RWL). In this case the other word-lines in the array, including the write word-line, as well as the bit-lines, are grounded.

If the bit-line (74a, 74b) is in the "1" state (released), the electrostatic force is sufficiently strong to pull up the bit-line so that it contacts RWL; however, if the bit-line is in the "0" state (stuck down), the electrostatic force is not strong enough to pull up the bit-line, wherein it remains stuck down to the underlying dielectric layer. Thus, stored information can be detected as current flowing through the bit-line. Consequently, current flows in response to storage of a "1" (bit-line 74b), while no current flows in response to storage of a "0" (bit-line 74a). It should be recognized that a current path cannot form between the same bit-line and any other read word-line, because the other read word-lines are grounded. Accordingly, no leakage current path exists in the other cells along the same bit-line, and hence no selection device is needed within each cell. It should also be appreciated that the difference in bit-line currents for the "1" and the "0" states is very much larger than the current differential provided within conventional memory devices. The above provides a number of significant advantages of the NEMory cell design over other cross-point memory cell designs.

2.2 Programming Operation.

Figure 22A:
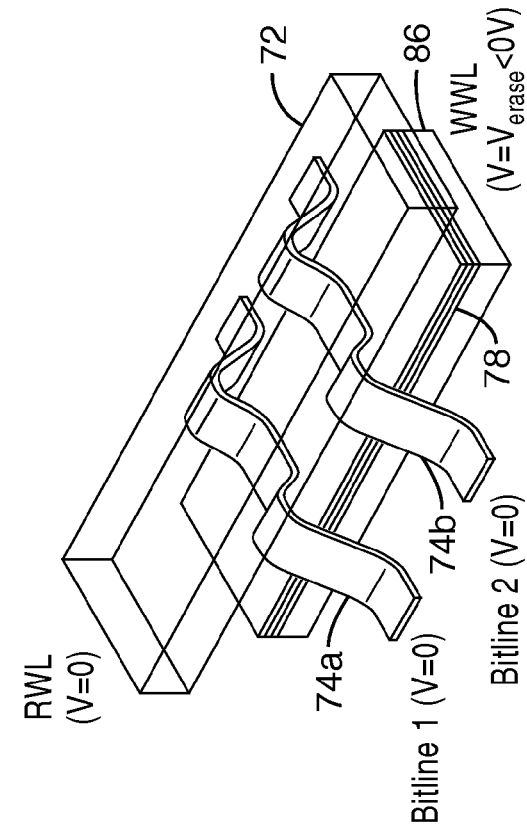
FIG. 22A is a perspective view of erasing memory cells on a word-line having a stored charge layer according to an aspect of the present invention.
Figure 22B:
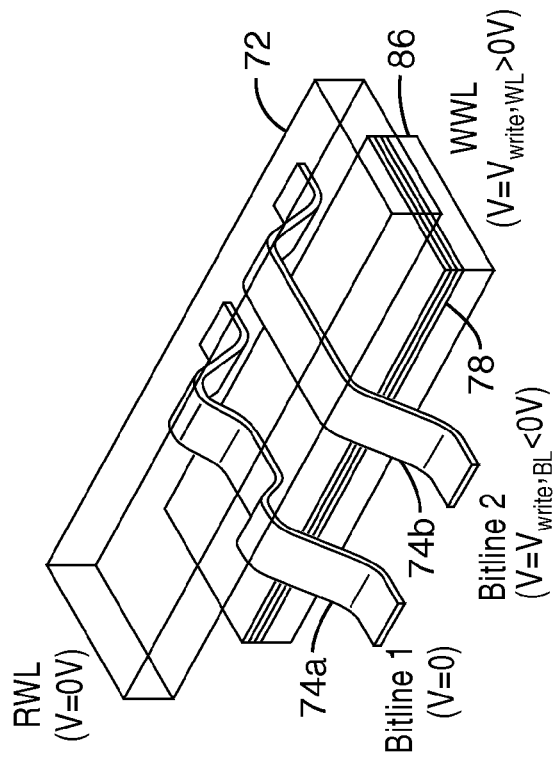
FIG. 22B is a perspective view of writing to selected memory cells on a word-line having a stored charge layer according to an aspect of the present invention.

FIG. 22A-22B illustrate erasing cells and writing into selected cells of a NEMory array, respectively, one word-line at a time. In FIG. 22A all of the cells are erased, with their bit-lines (74a, 74b) are stuck down within each cell, corresponding to the "0" state, by application of a sufficiently large negative bias to the write word-line (WWL) and grounding the read word-line (RWL) and all of the bit-lines. Next, in moving to FIG. 22B, each cell that is to store a "1" is written to by applying a positive bias to WWL and a negative bias to the bit-line, thereby creating a net voltage applied across the cell which is more negative than $V_{pull-out}$. The spring restoring force of the bit-line mechanical beam then causes a bit-line 74b to separate from the underlying dielectric. During this write operation, the bit-line is grounded for each cell that is to store a "0" in order to prevent the bit-line from being released within these cells. It should be appreciated that the state of other cells along the same bit-line will not be disturbed, because the net voltage applied is greater than $V_{pull-out}$, but less than 0V, since all of the other word-lines (WWL and RWL) are grounded.

The electrostatic force associated with the trapped charge of the write word-line can be established to any desired level based on the chosen material and structure of the layers as well as the extent to which charges 'loaded' into the layer. In a similar manner, it should be appreciated that mechanical forces, such as deformation force and spring restoring forces of the moveable portion of the mechanical beam can be controlled in response to the selection of both beam structure and materials for a given memory cell design. Similarly, the material, texture and structure of the beam and electrode and/or dielectric surfaces can be selected to control the extent to which stiction forces arise when a portion of the beam is in contact with either word-line.

3. NEMORY—ALTERNATIVE EMBODIMENT

Figure 24:
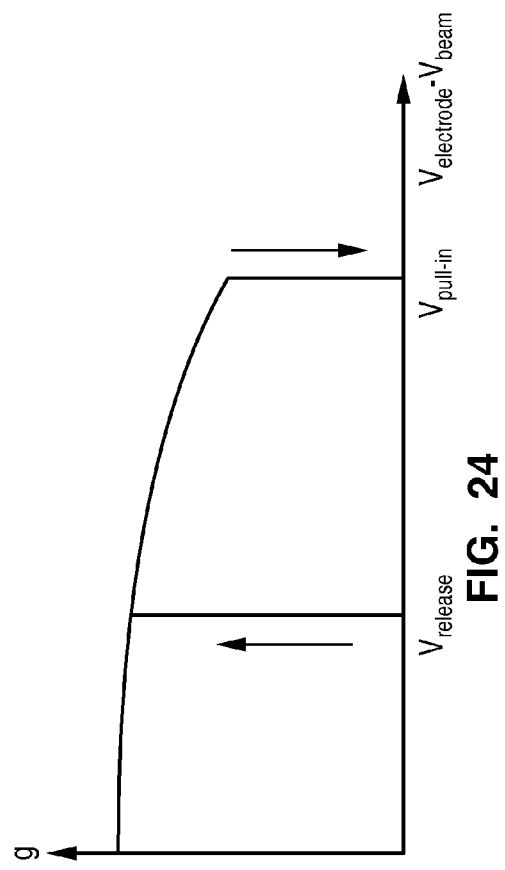
FIG. 24 is a graph of beam pull-in and release for the NEMory of FIG. 23.
Figure 23:
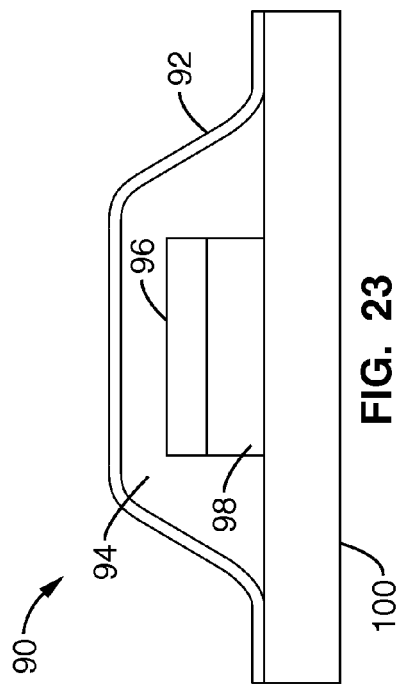
FIG. 23 is a cross-section of an electro-mechanical random access memory cell according to an embodiment of the present invention, showing a fixed lower electrode whose dielectric does not include a charge trapping layer.

FIG. 23 through FIG. 24 illustrate another alternative embodiment 90 of the electro-mechanical random access memory cell design described above. A cross-section is shown in FIG. 23 of a gap-closing actuator with double-clamped beam 92 suspended with a gap 94 over dielectric 96 over a fixed electrode 98 upon substrate 100. FIG. 24 depicts the gap-vs-voltage curve for the embodiment shown in FIG. 23. It can be seen from the graph that when a sufficiently large voltage ($V > V_{pull-in}$) is applied to the mechanical beam, the beam snaps down (pull-in). Subsequent to pull-in, a smaller voltage ($V_{release}$) is needed to hold the beam down, which results in the hysteretic behavior shown in FIG. 24. This hysteresis curve illustrates a structure in which the spring forces of the mechanical beam exceed stiction forces, wherein a small voltage field is required to maintain the pulled-in mechanical state.

3.1 Structure and Array Architecture.

Figure 25:
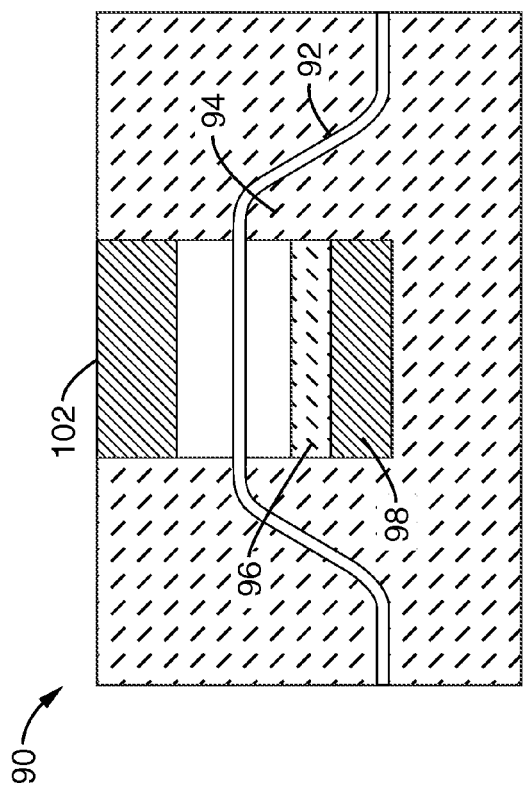
FIG. 25 is a cross-section according to an embodiment of the present invention, showing a top electrode as a read word-line (RWL) and a bottom electrode as a control word-line (CWL).

FIG. 25 illustrates a detailed structure 90 of the NEMory embodiment of FIG. 23. In this embodiment, a dielectric stack with dielectric 96 and bottom electrode 98 (i.e., control word-line), are shown opposite a top electrode 102 (i.e., read word-line). It should be recognized that for this example embodiment no charges are stored in the dielectric stack.

Figure 26B:
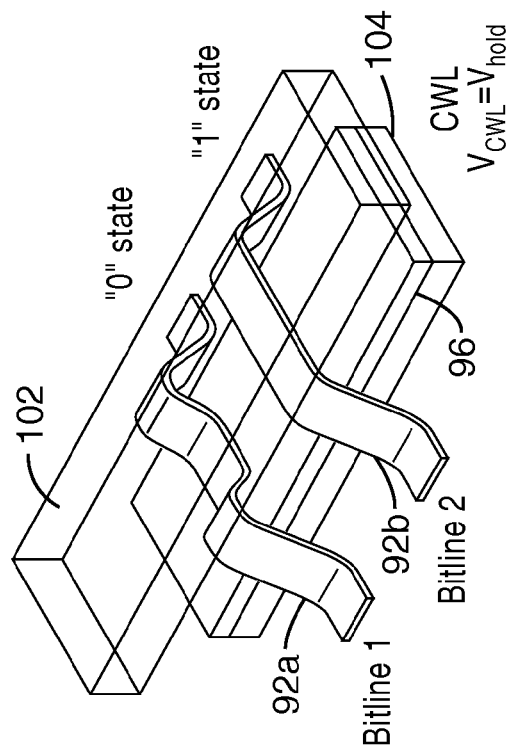
FIG. 26B is a perspective view of a NEMory cell according to an aspect of the present invention, showing a program mode.
Figure 26A:
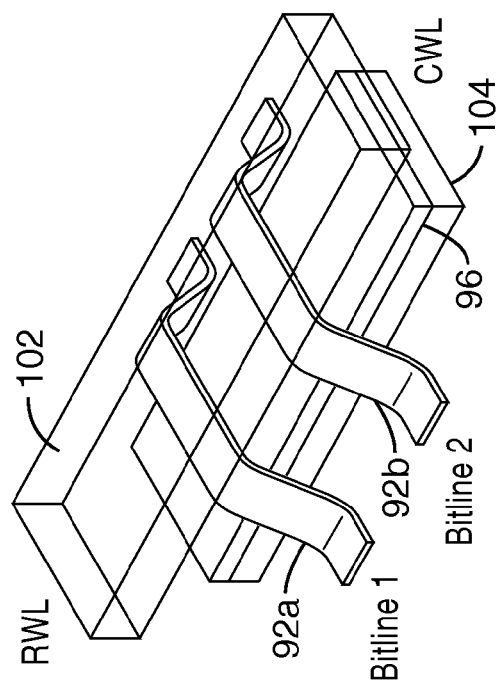
FIG. 26A is a perspective view of a NEMory cell according to an aspect of the present invention, showing a hold mode.

FIG. 26A through FIG. 26B illustrate that the physical position of the bit-line, specifically portions of the mechanical beams, defines the state of the stored information within the NEMory cell structures. In this embodiment a hold mode is utilized for retaining data state. In this hold mode control word-line 104 (CWL) is electrically biased to $V_{hold}$ such that bit-line 92a, 92b is bi-stable. An automatic erase occurs within the cells upon removal of the holding voltage. The two states of this bi-stable structure comprise the storing of a "0" if the bit-line is stuck down to the underlying dielectric, and the storing of a "1" if the bit-line is not stuck down (i.e., it is released). These three-dimensional views of two NEMory cells along the same word-line, show information stored as the physical state of the mechanical bit-line 92a, 92b, as read utilizing read word-line 102. This embodiment of the NEMory cell is also suitable for the aforementioned cross-point array architecture to provide high-density storage.

Figure 27:
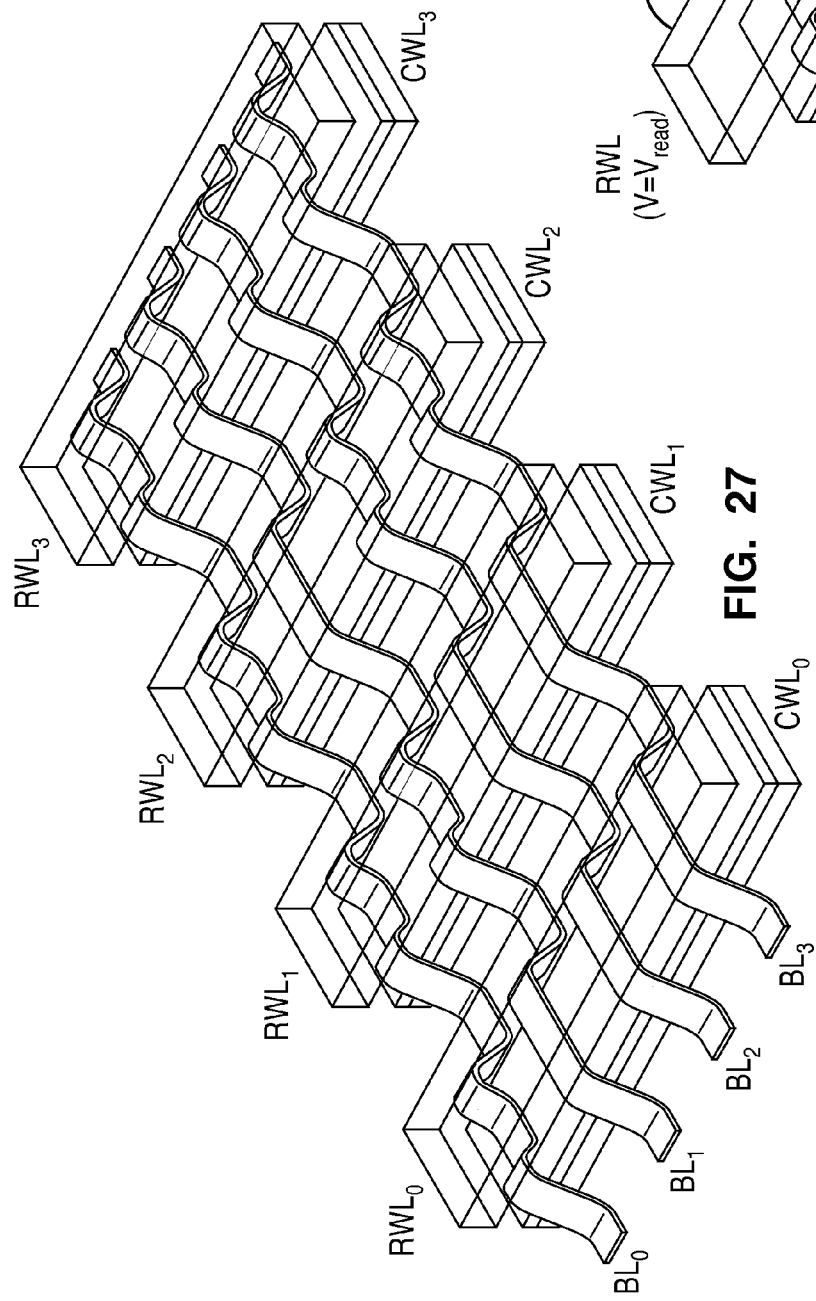
FIG. 27 is a perspective view of an array of the NEMory cells shown in FIG. 25.

FIG. 27 illustrates an array of NEMory cells (i.e., 4×4 array defined by the bit-lines and word-lines, showing cells in different states (data="0" or "1"). It will be appreciated that arrays of any desired size and configuration can be fabricated utilizing the apparatus and methods of the present invention.

3.2 Hold Operation.

To hold the information of the memory cell, the control word-line (CWL) is biased to a positive voltage $V_{hold}$. Other bit-lines and read word-lines are grounded, wherein the voltage drop across the CWLs and the bit-lines (i.e., $V_{CWL} - V_{BL} = V_{hold}$) lies between $V_{release}$ and $V_{pull-in}$. In this case the bit-line is bi-stable as seen in FIG. 26A through FIG. 26B. By defining the "0" as the state that the bit-line is stuck down, and "1" as the state that the bit-line is released, the data of the memory cell can be retained.

3.3 Read Operation.

Figure 28:
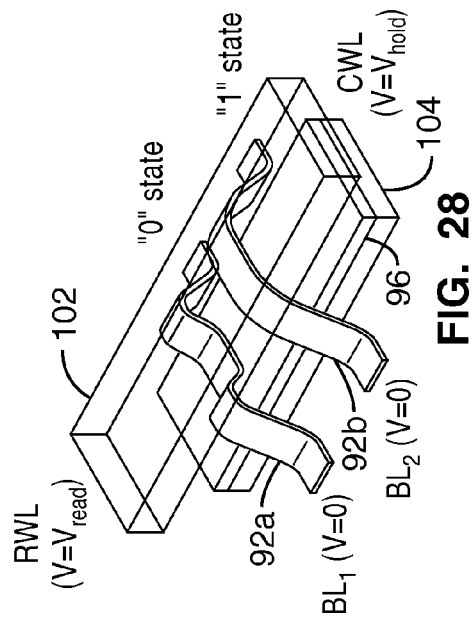
FIG. 28 is a perspective view of reading a NEMory cell according to an aspect of the present invention.

FIG. 28 illustrates reading information from a NEMory cell in response to application of a positive bias $V_{read}$ to the read word-line 102 (RWL), while other read word-lines in the array, as well as the bit-lines, are grounded. The control word-line 104 (CWL) is biased to $V_{hold}$ so that if the bit-line, 92a, 92b, is in the "1" state (released), the electrostatic force is sufficiently strong to pull up the bit-line so that it contacts RWL. However, if the bit-line is in the "0" state (stuck down), then the electrostatic force lacks sufficient strength to pull up the bit-line, wherein it remains stuck down to the underlying dielectric layer. Thus, stored information can be detected as current flowing through the bit-line, wherein if a "1" is stored then current will flow, and if a "0" is stored then no current will flow. It should be recognized that a current path cannot form between the same bit-line and other read word-lines, since these other read word-lines are grounded. Accordingly, there is no leakage current from the other cells along the same bit-line, and hence no selection device is required within each cell. The difference in bit-line currents for the "1" and the "0" states is very large in comparison to the current difference provided by conventional memory cells whose state can be difficult to detect with a simple circuit. The above benefits are significant advantages of the NEMory cell design in comparison with other cross-point memory cell designs.

3.4 Programming Operation.

Figure 29B:
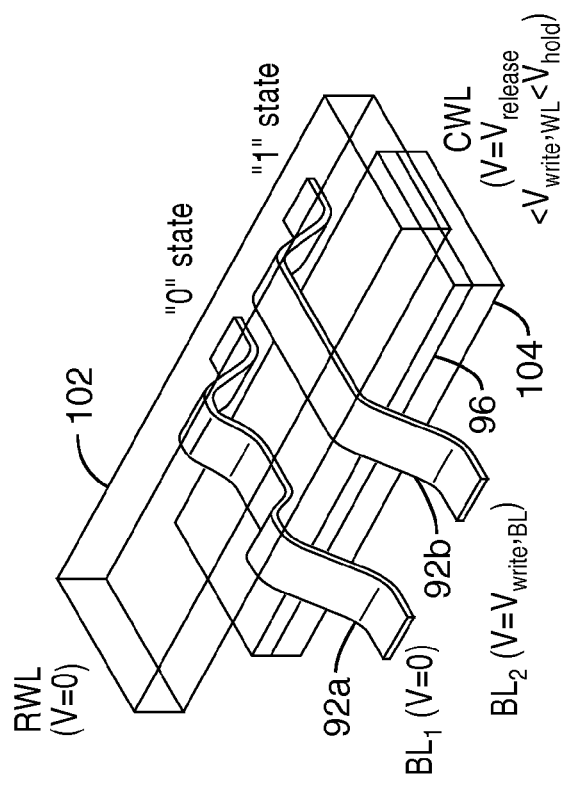
FIG. 29B is a perspective view of writing to selected cells of a NEMory cell array according to an aspect of the present invention.
Figure 29A:
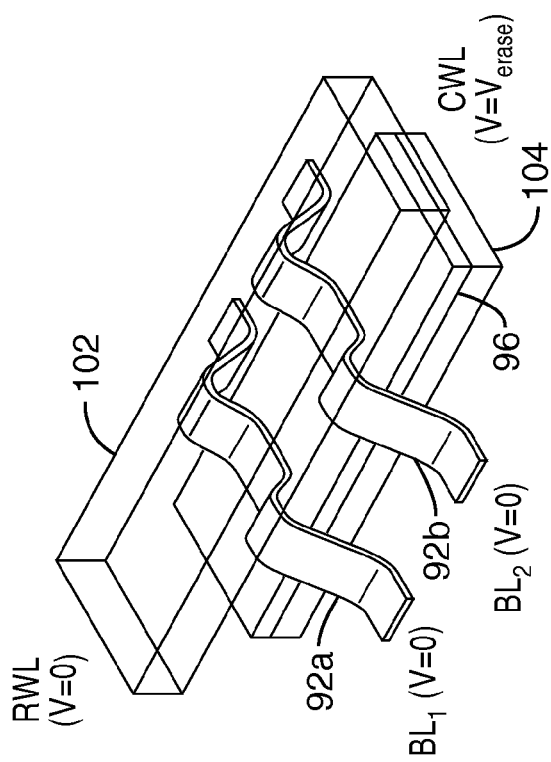
FIG. 29A is a perspective view of erasing a plurality of NEMory cells within an array, according to an aspect of the present invention, shown in preparation for writing into selected cells.

FIG. 29A through FIG. 29B illustrates the writing of information into a NEMory cell, such as one word-line at a time. First, as per FIG. 29A, the desired cells are erased, with their bit-lines 92a, 92b, stuck down within each cell corresponding to the "0" state, by applying a sufficiently large positive bias to the CWL and grounding the RWL and the bit-lines. Next, as represented by FIG. 29B, the selected control word-line 104 (CWL) is biased to some positive voltage $V_{write, CWL}$. The magnitude of $V_{write, CWL}$ should be slightly larger than $V_{release}$, but less than $V_{hold}$. Each cell that is to store a "1" is then written by applying a positive voltage $V_{write, BL}$ so that the net voltage applied across the cell is less than $V_{release}$ (as seen in FIG. 24). The spring restoring force of the bit-line mechanical beam causes the bit-line to separate from the underlying dielectric. During the write operation, the bit-line is grounded for each cell that is to store a "0". As the CWL is biased to $V_{write, CWL}$, the net voltage drop across the "0" bit-lines and the CWL remains in the hysteretic range which prevents the bit-line from being released within these cells. The state of other cells along the same bit-line is not disrupted, because the net voltage being applied is greater than $V_{release}$, since all of the other control word-lines are in hold mode.

4. RANDOM ACCESS MEMORY (NEMRAM)

As described in the background of the invention, as the channel length of the transistors of a memory cell approach the nanoscale regime the control of the short channel effects becomes an increasingly difficult challenge to overcome. The scaling of traditional random access memory cells like 6T SRAM, DRAM or FLASH is even more difficult in view of the tighter requirements for static leakage, tolerance to process variation, and immunity to noise. Many new ideas, such as the vertically stacked SRAM, double-gate DRAM and nanodot flash have been proposed and pursued toward addressing this plethora of problems.

The concept of a universal memory (e.g., memory with DRAM-like density, SRAM-like read and write speed, write/erase endurance and flash-like non-volatility) is especially attractive for a next generation memory technology. Many novel memory structures like ferroelectric RAM (FeRAM) and magnetic RAM (MRAM) have been proposed as potential candidates of such universal memory. However, numerous obstacles need to be overcome in pursuing these technologies, such as the need for new materials, as well as both cost and fabrication constraints as a consequence of the use of new materials and processes.

A new breed of memory is described herein for a nano-electromechanical RAM (NEMRAM), which utilize a nanoscale mechanical beam and the phenomenon of surface adhesion of material as the means of information storage by stabilizing one or more of the data states. The NEMRAM devices described can be fabricated according to standard fabrication tools and materials and are highly scalable into the nanoscale regime, making them particularly well-suited as universal memory for ultra low-cost and low-power electronics applications.

4.1 Surface Adhesion as a Means of Information Storage.

Surface adhesion between materials is a property that has long been observed in the micro-electro-mechanical systems (MEMS). Once two material surfaces are brought together, an intermolecular force, "stiction", is generated whose magnitude depends on the area, materials, structure and texture of the surfaces in contact with one another. While such "stiction" effect generally reduces the reliability of MEMS, its non-volatile nature is utilized herein as a basis for these memory devices. For instance, a new breed of memory storage is described in which both states "1" and "0" can be adapted as stable states, thus providing an immediate energy advantage over traditional RAM technology because no standby power is needed to retain (hold) the information (data bits).

It will be recognized that embodiments discussed in earlier sections of the application relied upon a hold force arising from electrostatic forces created by charge trapping layers or from electrode hold voltages to provide a holding force counteracting the spring deflection force of the beam to provide state stability. In this embodiment, the beam material, size, and shape are configured to create a desired level of stiction force when pulled against a surface when in a deflected position. The surface against which the beam sticks, is similarly selected as to compatible material, texture, and structure, to create a desired level of stiction.

Figure 30:
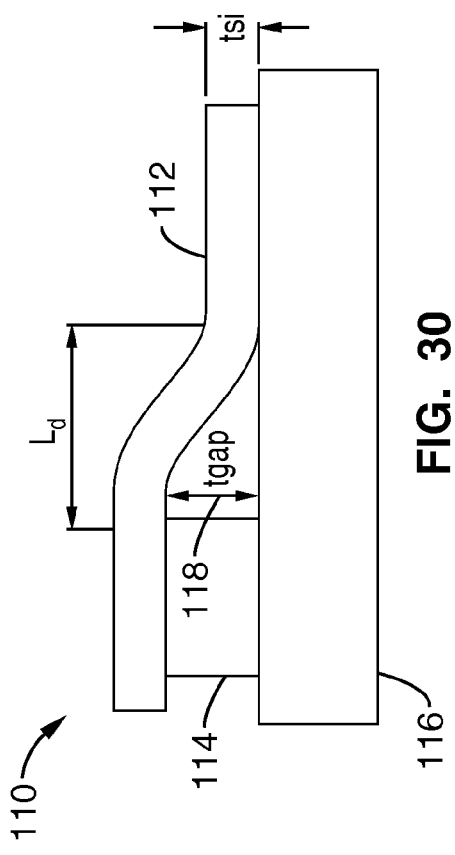
FIG. 30 is a side view of a cantilever beam according to an aspect of the present invention, showing stiction with a substrate surface.

FIG. 30 illustrates an example embodiment 110 of a cantilever beam 112 extending from anchor 114 to adhere to a surface 116 (substrate), leaving a gap 118 between a portion of the beam and the substrate. Quantitatively, when a cantilever beam is displaced by a distance $t_{gap}$ 118 from equilibrium and adheres to surface 116, the surface adhesive energy is transferred to the potential energy stored in the beam. When the spring restoring energy of beam 112 is smaller than the surface adhesion energy, the beam will be permanently held by the substrate.

More specifically, by using the energy method of beam bending, it can be shown that, $$L_d = \left( \frac{3}{8} \cdot \frac{Et_{si}^3 t_{gap}^2}{W_s} \right)^{1/4} \qquad (1)$$

where $W_s$ is the surface adhesive energy per unit area, E=Young Modulus of the beam. For silicon E=190 GPa, $PE_{beam}$ is the bending energy per unit area, $L_d$ is the detachment length indicating for example the length of the beam that is not attached to the underlying surface.

4.2 Physics of the NEMRAM Cell.

Figure 31:
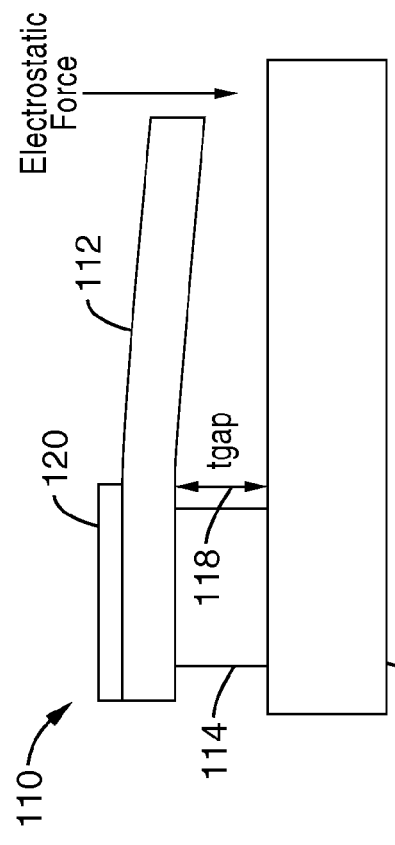
FIG. 31 is a side view of a cantilever beam according to an aspect of the present invention, showing deflection (no contact or stiction) in response to application of electrostatic forces.

FIG. 31 illustrates a case in which a voltage bias is applied between beam 112, through electrode 120, and a fixed electrode, comprising the substrate (i.e., ground). In response to the voltage field to which the beam is subject, an electrostatic force is induced which bends the beam towards the substrate electrode 116. The air-gap thickness between a beam and a fixed electrode reduces when an electrostatic force is induced by their potential difference. When the voltage bias is too high, the electrostatic force dominates the spring restoring force. The beam will then be attracted towards and attach to the electrode. This phenomenon is called "pull-in" and the voltage at which pull-in occurs is denoted as $V_{pull-in}$. Once pull-in happens, the surface adhesion force holds the beam and the electrode in position. It should be recognized that the physics of a mechanical beam under voltage bias are discussed at length in a number of textbooks describing MEMS fabrication and thus need not be discussed at length herein.

Figure 32:
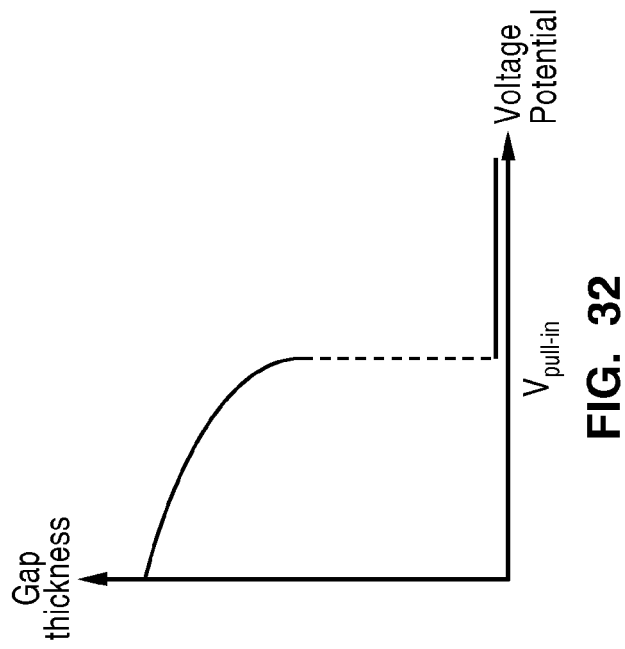
FIG. 32 is a graph of pull-in of the cantilever beam in response to applied voltage according to an aspect of the present invention.

FIG. 32 is a graph summarizing the relationship between air-gap thickness and applied voltage required for pull-in. It should be recognized that a sharp transition at $V_{pull-in}$ is depicted by the graph. Unlike the sub-threshold slope of a transistor, the pull-in of a beam is not bounded by the 60 mV/dec thermal limit. In fact, the "inverse sub-threshold slope" of a beam at $V_{pull-in}$ is infinite, thus making it an ideal switch as it has infinite gain.

As described, the surface adhesion force can permanently hold the beam and the electrode together in response to "stiction". However, this permanent state may not be favorable unless one wants to be limited to producing one-time-programmable memory cells.

Figure 33B:
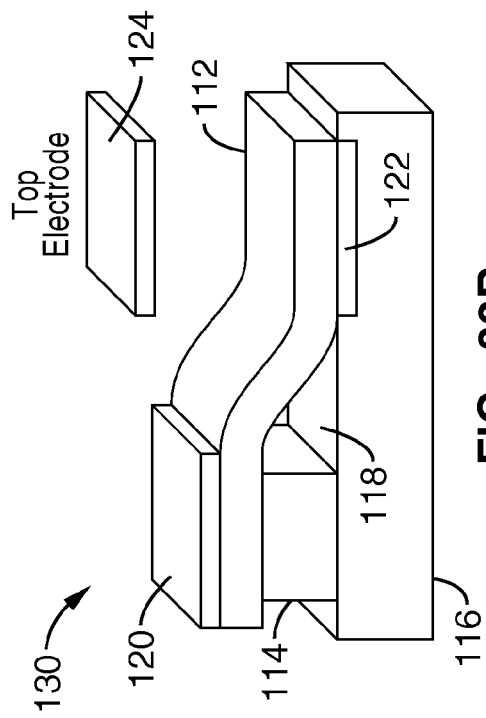
FIG. 33B is a side view of the memory cell of FIG. 33A, shown in stiction with the bottom electrode.
Figure 33C:
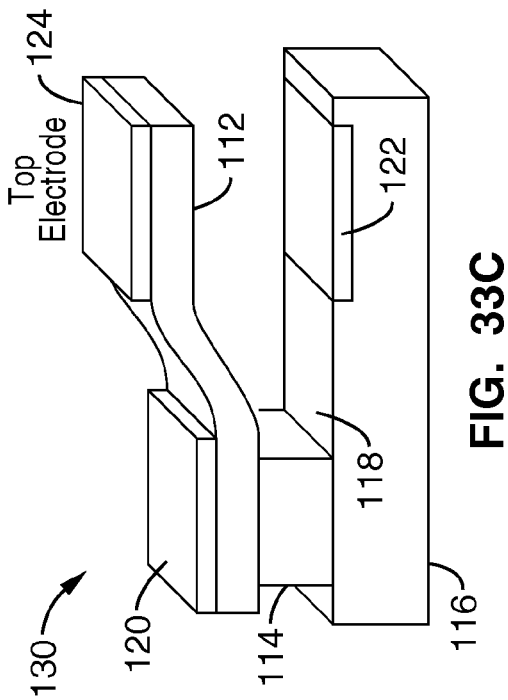
FIG. 33C is a side view of the memory cell of FIG. 33A, shown in stiction with the top electrode.
Figure 33A:
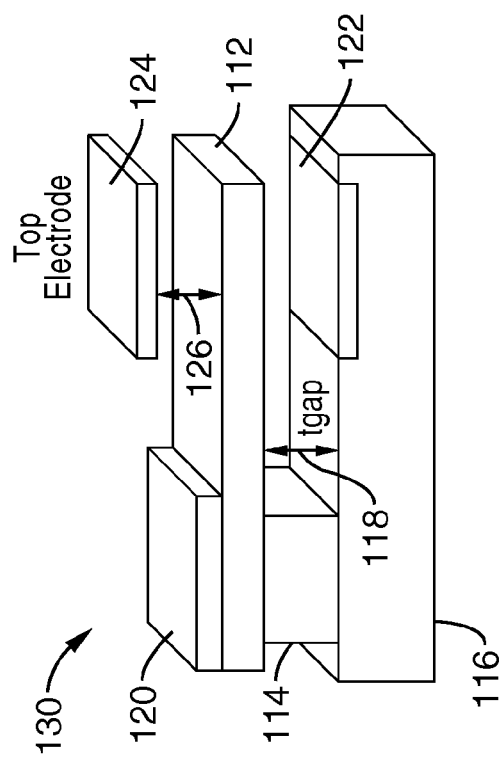
FIG. 33A is a side view of a memory cell based on a cantilever beam directed by top and bottom electrodes providing bi-stable stiction according to an embodiment of the present invention, shown in a non-displaced beam state.

FIG. 33A through FIG. 33C illustrate an example embodiment 130 in which an extra electrode is added over the beam to allow the "stiction" forces to be overcome. In FIG. 33A a beam is shown in a position in a non-biased, non-stiction position with proximal end of beam 112 attached to anchor 114 on substrate 116 with gap 118 between the beam 112 and substrate 116. A beam electrode 120 is shown along with an electrode 122 (bottom electrode) on substrate 116. A second electrode 124 is added above beam 112, separated by gap 126, to allow forcing the beam to hold toward either electrode 122 or 124 in response to a sufficient voltage excursion. Gap 126 is shown between beam 112 and electrode 124, which preferably is configured for the same gap distance as gap 118, however, these gaps need not be equal. It should be appreciated that a special case of the memory arises when gap 126 is a null gap, wherein beam 112 in a non-deflected state as shown in FIG. 33A sticks against electrode 124 and can be deflected by electrostatic forces into stiction contact with electrode 122.

Beam 112 is adhered to the bottom electrode, as shown in FIG. 33B, in response to application of a sufficiently strong electrostatic force between the beam and the bottom electrode to direct the beam into stiction contact. FIG. 33C shows the use of top electrode 124 to unstick beam 112 from substrate 116 by exerting a strong electrostatic pulling force on the latter between beam 112 and upper electrode 124. The beam is thus separated from the bottom electrode 122 and drawn into adherence with the top electrode 124. Thus, the mechanical beam can remain in static equilibrium when stuck to either the top or bottom electrode, wherein it is particularly well-suited for storing binary information.

Figure 34:
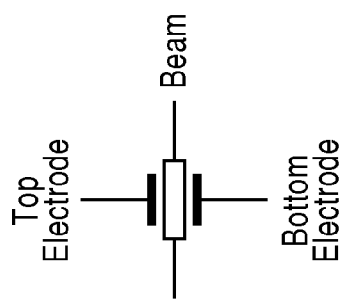
FIG. 34 is a symbol utilized for representing the vertical displacement beam (single or double anchor) according to an aspect of the present invention.

FIG. 34 illustrates a symbol utilized herein to delineate the three-terminal bi-stable device of FIG. 33A, which may comprise the core of a nano-electromechanical random access memory (NEMRAM) cell.

Figure 35:
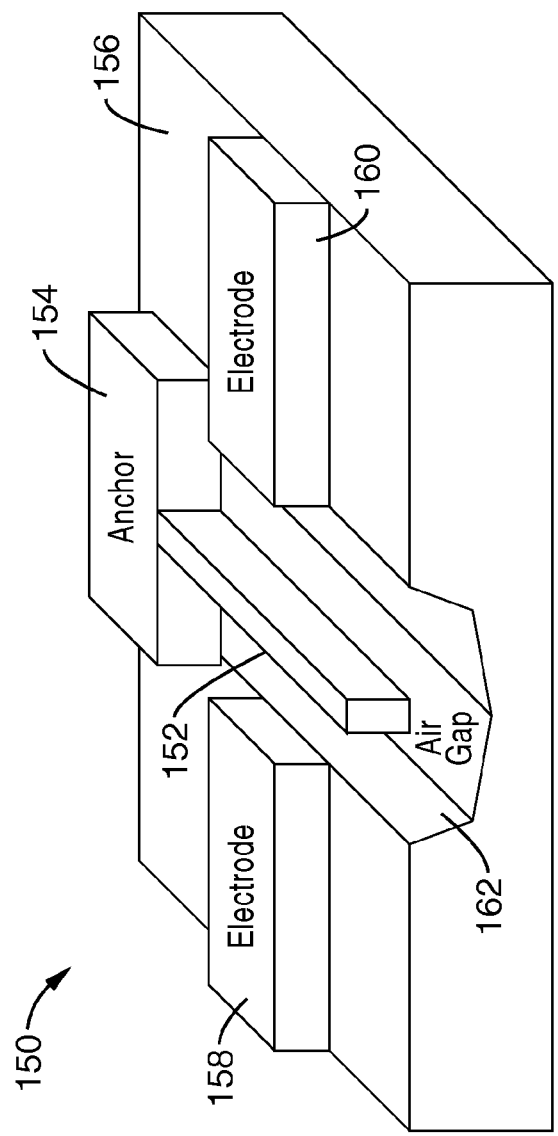
FIG. 35 is a perspective view of a lateral displacement beam NEMory cell according to an aspect of the present invention, showing a singly-anchored beam configured for translation along the same plane as the substrate.

FIG. 35 illustrates an example embodiment 150 of a laterally-oriented beam device. In the figure a beam 152 is shown connected at a proximal end to anchor 154 as a single-clamped beam. A substrate 156 is shown upon which a first electrode 158 and second electrode 160 are joined. A separation 162 (e.g., air gap) of some sort preferably prevents interference during beam translation between first and second electrodes. It should be appreciated that the described NEMRAM cell can be fabricated for beam actuation directed through any desired plane, while both single and double-clamped beams can be realized. It is interesting to note that the laterally actuated mechanical beam bears some resemblance to an independent-gate FinFET transistor, although they operate according to wholly different principles.

FIG. 36 depicts a symbol that is utilized herein for representing a laterally-actuated NEMRAM device.

4.3 Static Behavior in Response to Write Voltage.

In the previous section, the write and read operations for the NEMRAM structure were described qualitatively. The following presents a more quantitative approach for obtaining the static behavior of a NEMRAM, and more specifically, the voltage for write operation, $V_{write}$, is derived.

The energy per unit area of surface adhesion is characterized by $W_S$. Consider the case in which a particular NEMRAM cell has already been written, wherein the beam is secured to a given electrode referred to as electrode. In order to flip the state of the cell such that the beam adheres to the opposing electrode, referred to as $\overline{\text{electrode}}$, sufficient energy must be applied to overcome $W_S$. This energy can be supplied by applying $V_{write}$ to the air-gap capacitance, C=capacitance per unit area, between the beam and desired electrode as given by:

$$\frac{1}{2} \cdot CV_{write}^2 = W_S \qquad (2)$$

Ignoring the fringing electric field yields, $$C = \frac{\varepsilon_{air}}{2t_{gap}} \qquad (3)$$

Plugging Eq. 3 into Eq. 2, the value for $V_{write}$ is derived:

$$V_{write} = \sqrt{\frac{4 W_s t_{gap}}{\varepsilon_{air}}} \text{ or,} \tag{4}$$

For $t_{si}$=20 nm, $t_{gap}$=25 nm and $W_s$=200 µJ/m², $V_{write}$=1.5V.

4.4 NEMRAM as a Simple Resistor-Capacitor Circuit.

As described earlier, the information stored by an NEMRAM cell is determined by the position of the beam. In a previous section, the static behavior of the NEMRAM was explained. In this section the NEMRAM cell is characterized as a simple circuit element to provide insights that may be utilized for circuit design, especially for transient analysis.

The different states of an NEMRAM device can be captured by a simple resistance-capacitor circuit. When the beam is attached to one of the electrodes, the beam and the electrode are shorted and can be treated as a resistor. To the first order, the resistance can be computed by the following equation:

$$R_{NEM} \cong \frac{\rho_{si} L_{si}}{A_{si}} = \frac{\rho_{si} L_{si}}{W_{si} t_{si}} \tag{5}$$

If the beam is actuated and attached to the opposite electrode, the original electrode and the beam will form an open circuit and can be modeled by an air-gap capacitor. This capacitance can be calculated by $$C_{NEM} \cong \frac{\varepsilon_{air}}{2 t_{gap}} A_{gap} = \frac{\varepsilon_{air}}{2 t_{gap}} W_{si} L_{si} \tag{6}$$

From the above equations it is understood that a change in resistance between the electrode and the beam will take place (from $R_{NEM}$ to infinity) when the state of the device switches. A similar analysis can be carried out for the other electrode position.

FIG. 37 through FIG. 38 illustrate equivalent circuits for the two stiction states of the beam. Depending on the adhesion position of the beam, a NEMRAM structure can be modeled by a simple capacitor-resistor circuit in FIG. 37 when the beam sticks to the left electrode and FIG. 38 when the beam sticks to the right electrode.

5. CIRCUIT TOPOLOGIES FOR NEMRAM

In order to communicate (interface) with external electronics, the NEMRAM cells must be able to convert their mechanical states back and forth to electrical signals. Circuitry adapted for detecting resistive difference are well established, such as for memory applications like MRAM. Circuitries, such as MRAM, can easily be utilized with slight modification to operate NEMRAM cells. In general, three main circuit architectures are discussed herein, namely 2T-1NEM, 1T-1NEM and cross-point NEMRAM cells that are suitable for NEMRAM operations. These different circuit architectures are well-suited for use in different situations and for trading off one performance metric, such as memory density, for another performance metric, such as speed.

5.1 2T-1NEM:NEMRAM Storage Cell in 6T SRAM.

FIG. 39 illustrates a way to connect an NEMRAM cell and two transistors together as a 2T-1NEM NEMRAM cell for performing proper memory operations. By connecting the two electrodes to the drains of the two transistors respectively, the NEMRAM cell can be read and programmed by external circuitry. The two electrodes are connected to the drains of transistors T1 and T2 respectively, while the beam electrode is retained at a fixed (i.e., ground) potential. The gates of the transistors are connected to the word-line (WL) while the sources of the two transistors are connected to two separate bit-lines (BL and $\overline{BL}$).

The similarity between this 2T-1NEM circuit and the traditional 6T SRAM provides a number of benefits. The 2T-1NEM circuit can be created by replacing the cross-coupled inverters in the 6T SRAM cell by the three-terminal nano-electro-mechanical actuator, which can then be treated as a "mechanical flip-flop". In fact, the majority of the sensing schemes and circuitry of 6T SRAM cells can be re-used for reading and writing 2T1NEM cells, thus reducing the cost and development times required for designing new external circuitry. This is especially beneficial as the material and fabrication process of the nano-electro-mechanical actuator is compatible with the material the fabrication processes utilized for the access transistors.

(a) Write Operation of a 2T-1NEM NEMRAM.

FIG. 40 illustrates that the 2T-1NEM NEMRAM cells can be programmed, one word-line at a time, by applying a voltage bias ($V_{DD}$) on the word-line.

It will be recognized from the prior discussions, that the transistors along the active word-line are turned on to make the cells programmable, while the remaining transistors are unselected. Complementary signals are applied to BL and $\overline{BL}$ to program the cell into a particular state. To write a data "1", a voltage bias $V_{DD}$, which should be larger than $V_{write}$, is applied to BL while $\overline{BL}$ is at ground, thereby flipping the beam of NEMRAM to BL. Similarly, to write a data "0", a voltage bias $V_{DD}$ is applied to $\overline{BL}$ while BL is held at ground.

FIG. 41 through FIG. 42 illustrate circuit equivalents for the final "1" and "0" states, respectively, of a cell represented by the equivalent circuit diagrams.

(b) Read Operation of A 2T-1NEM NEMRAM.

FIG. 43 illustrates an example of read operation for a 2T-1NEM NEMRAM cell. Similar to a 6T SRAM cell, the bit-lines (BL and $\overline{BL}$) of a 2T-1NEM NEMRAM cell are all precharged to $V_{read}$, which should be smaller than voltage $V_{write}$ to prevent unwanted disturbance of the cells. A voltage bias $V_{DD}$ is applied to the selected word-line such that the cells along the word-line are activated. One of the bit-lines is discharged to ground, and the read time can be determined by using the circuit model illustrated earlier.

FIG. 44 illustrates the dependencies of the bit-line voltage difference with respect to time. If a data "1" is stored in the NEMRAM cell, the voltage of BL will gradually drop because the bit-line is connected to ground through the mechanical beam. On the other hand, the voltage of $\overline{BL}$ remains fairly constant, indicating that a voltage difference between the bit-lines will gradually build up, until it can be detected by a sense amplifier. Similarly, if a data "0" is stored in the NEMRAM cell, a voltage difference between the bit-lines will gradually build up, yet in this case, it is in $\overline{BL}$ that the voltage drops.

5.2 1T-1NEM: NEMRAM as a Non-Volatile DRAM.

FIG. 45 illustrates another schematic in which an NEMRAM can be integrated in a 1T-1NEM circuit with an NMOS circuit to provide appropriate read and write operation to achieve a higher memory density.

In this configuration, the source of the NMOS transistor is connected to the mechanical beam of the NEMRAM. One of the electrodes is always grounded and the other electrode is used as a control word-line (CWL). In similar manner to a DRAM cell, the NMOS is utilized herein as a pass transistor and the gate and the drain of the NMOS are connected to the word-line and bit-line respectively. In this implementation, all the memory cells connected on the same word-line are presumed to share the same control word-line.

(a) Write Operation of a 1T-1NEM NEMRAM.

Similar to 2T-1NEM, 1T-1NEM NEMRAM can be programmed one word-line at a time, in response to applying a high-voltage bias ($V_{DD}$) on the word-line, with another high-voltage bias being applied to the control word-line.

To program a data "1", the bit-line, and hence the mechanical beam, is pulled up to $V_{write}$. It will be recognized that the electrostatic force between the beam and the grounded electrode will attract and hold them together.

Similarly, to program a data "0", the mechanical beam is grounded, wherein the beam will be attracted and held by the top electrode (control word-line), as the electrode is at a high-voltage bias.

(b) Read Operation of a 1T-1NEM NEMRAM.

To read the data stored in the 1T-1NEM NEMRAM cells, the word-line of the selected row is turned on. The control word-line of the selected row will also be pulled up to $V_{read}$, which should be smaller than $V_{write}$ to prevent unwanted disturbance of the data.

Depending on the position of the mechanical beam, the bit-lines will reach a different final voltage. If the mechanical beam is adhered to the bottom electrode, which is grounded, the bit-line voltage will be discharged to ground. Similarly, if the beam is stuck to the top electrode (i.e., the control word-line), then the bit-line voltage will gradually reach to $V_{read}$. By comparing the final voltage of the bit-line with a reference voltage, a voltage difference can be detected by the sense amplifier and thus the data stored in the memory can be read correctly.

It should be appreciated that the read operation of a 1T-1NEM memory cell is non-destructive, unlike that of 1T1C DRAM and of a FeRAM. This aspect provides numerous benefits and reduces circuit complexity and power requirements in that periodic refresh and data rewrite operations can be eliminated.

(c) Tradeoff Between 2T-1NEM and 1T-1NEM.

An advantage of using 1T-1NEM instead of 2T-1NEM, is that transistor area of the circuit structure can be reduced. However, a trade-off arises for this area reduction with the cost of single-ended signal output, and a slightly more complicated read/write scheme and wire routing. Single-ended signal output reduces the noise immunity and speed of these 1T-1NEM cells when compared with a double-ended arrangement of the 2T-1NEM topology.

5.3 Cross-Point NEMRAM Fabric (XP NEMRAM).

A Vertically Stackable, Ultra-High Density (Sub-4F$^2$) Memory Array is described which provides further increases in packaging density. Even though 2T-1NEM and 1T-1NEM NEMRAM circuit topologies can reduce the area of the memory, the requirement to include NMOS pass transistors still constrains the highest achievable density. The elimination of transistors will be favorable as it is possible to vertically stack the memory to save foot print area. This is possible with NEMRAM.

It should be recognized that all the NEMRAM cells on the same word-line share the same top and bottom electrode, wherein all the cells along the same bit-line have their beams electrically connected. The top and bottom electrode now constitute the word-line (WL) and its complement ($\overline{WL}$), respectively. And the mechanical beams act as the bit-lines of the memory.

This configuration forms a giant cross-point fabric of NEMRAM cells without the use of any transistors. Layers of NEMRAM cells can be stacked on top to achieve a ultra-high density memory block.

(a) Write Operation of Cross-Point NEMRAM.

To program data into the XP NEMRAM, differential voltage signal $V_{DD}$ and GND are applied to WL and $\overline{WL}$ respectively. All the other unselected word-lines are left as grounded. The magnitude of $V_{DD}$ should be larger than $V_{write}$.

To program a "1", the bit-line is pulled-up to $V_{DD}$. As the voltage difference between the beam and $\overline{WL}$ is larger than $V_{write}$, the mechanical beam is attracted to $\overline{WL}$ where it adheres and holds its position there.

To program a "0", the bit-line is grounded. The voltage difference between WL and BL will pull the mechanical beam to WL, where it adheres and holds its position.

(b) Read Operation of Cross-Point NEMRAM.

To read the data stored in XP-NEMRAM, differential voltage bias $V_{read}$ and a ground potential is applied to the selected WL and $\overline{WL}$. As in the case of 1T-1NEM cells, special care is required in the design of $V_{read}$ to prevent unwanted disturbance of the states, specifically $V_{read}$ must be smaller than $V_{write}$.

The bit-lines in this case are thus charged to a different voltage level depending on the location of the beam. If the mechanical beam is adhered to WL, the output voltage on the bit-line will be $V_{read}$; while if the mechanical beam is adhered to $\overline{WL}$, the output voltage on the bit-line will be 0. A sense amplifier can be used to detect the voltage difference and thus read the data.

(c) Tradeoff Between 2T-1NEM, 1T-1NEM and XP-NEMRAM.

The footprint of an XP-NEMRAM ranges approximately from 4F$^2$ to 8F$^2$. By vertically stacking N layers of XP-NEMRAM, the footprint area per bit is decreased by a factor of N, and thus dramatically increases memory density and correspondingly reduces cost.

However, the ultra-high density of XP-NEMRAM cells is achieved at the cost of cell speed. As mentioned earlier, an NEMRAM cell can be modeled as a simple resistor-capacitor circuit. As the cross-point NEMRAM is constructed by connecting the cells in series, the resultant electrical circuit becomes a large RC network, with first order delay being given by:

$$t_{XP-NEMRAM} \cong 0.69 R_{NEM} C_{NEM} \frac{n(n+1)}{2} \quad (7)$$
$$\cong 0.69 \frac{\varepsilon_{air} \rho_{si} L_{si}^2}{2 t_{gap} t_{si}} \frac{n(n+1)}{2}$$

where n is the number of NEMRAM cells in series.

This delay equation is very similar to that of transmission gate logic. As the density of the cross-point NEMRAM is high, (i.e., n is a large number, the delay time increases in O(n$^2$) time. Thus, cross-point NEMRAM is particularly well suited for ultra-high density secondary storage in which density and cost considerations overshadow the need for speed.

It should be appreciated that this cross-point NEMRAM can be applied to numerous circuit applications beyond ultra-high density memory. For example, a cross-point NEMRAM structure can be essentially considered a programmable interconnect fabric, for example providing an excellent platform for look-up tables in defect tolerant architectures, such as may provide a promising solution to nano-scale computation.

5.4 A Detailed Performance Analysis of 2T-1NEM.

The previous section illustrates several different methods of integrating a NEMRAM cell with CMOS for appropriate operation. Here, without loss of generosity, the 2T-1NEM memory cell is used as an example to illustrate how different performance metrics, namely speed, area, power and static noise margin can be estimated to provide insights for circuit designers.

(a) Delay Analysis of NEMRAM: $t_{write}$ and $t_{read}$.

The different states of NEMRAM can be modeled as simple resistance-capacitor circuits, as mentioned earlier, which can be utilized for approximating the transient behavior of the mechanics of the beam. By utilizing these simulations, circuit designers can more readily design NEMRAM cells without breaking the abstraction layers to the underlying physics of NEMRAM.

(b) Read Operation.

A read operation of NEMRAM can be analyzed by using the RC model described in the previous section. Assuming that the cantilever is adhered to the electrode that is connected to the bit-line (BL). Any precharged voltage $V_{read}$ applied to BL will gradually be discharged to ground by the cantilever. The discharge process involves the resistance of the NEMRAM ($R_{NEM}$) in series with the resistance of the pass transistors ($R_{MOS}$) and the bit-line capacitance ($C_{BL}$). Thus, the following relation holds:

$$V_{BL}(t) = V_{read} e^{\frac{-t}{(R_{MOS}+R_{NEM})C_{BL}}} \quad (8)$$

Similar analysis can be performed to investigate transient behavior of $\overline{BL}$. The equivalent RC network involves the capacitance of the NEMRAM ($C_{NEM}$) connected in series with the resistance of the pass transistor ($R_{MOS}$) and the $\overline{BL}$ capacitance ($C_{\overline{BL}}$). As the voltage of $\overline{BL}$ is precharged to $V_{read}$, charge sharing takes place between $C_{NEM}$ and $C_{\overline{BL}}$. The voltage transient behavior of $\overline{BL}$ can be characterized by the following equation:

$$V_{\overline{BL}}(t) = V_{read}\left(\frac{C_{\overline{BL}}}{C_{NEM}+C_{\overline{BL}}}\right) + V_{read}\left(\frac{C_{NEM}}{C_{NEM}+C_{\overline{BL}}}\right)e^{\frac{-t}{R_{MOS}(C_{NEM}\|C_{\overline{BL}})}} \quad (9)$$

The two bit-lines are connected to a sense amplifier that will amplify their voltage difference. Subtracting $V_{\overline{BL}}(t)$ from $V_{BL}(t)$, the following is arrived at:

$$\Delta V(t) = |V_{BL}(t) - V_{\overline{BL}}(t)| \quad (10)$$

$$= V_{read}\left(\frac{C_{\overline{BL}}}{C_{NEM}+C_{\overline{BL}}}\right) +$$

$$V_{read}\left(\frac{C_{NEM}}{C_{NEM}+C_{\overline{BL}}}\right)e^{\frac{-t}{R_{MOS}(C_{NEM}\|C_{\overline{BL}})}} -$$

$$V_{read}e^{\frac{-t}{(R_{MOS}-R_{NEM})C_{BL}}}$$

$$= V_{read}\left[\frac{C_{\overline{BL}}}{C_{NEM}+C_{\overline{BL}}} + \left(\frac{C_{NEM}}{C_{NEM}+C_{\overline{BL}}}\right)e^{\frac{-t}{R_{MOS}(C_{NEM}\|C_{\overline{BL}})}} - e^{\frac{-t}{(R_{MOS}+R_{NEM})C_{BL}}}\right]$$

Thus, for a particular value of $\Delta V$, $t_{read}$ can be determined by Eq. 10, and specifically, when time tends toward infinity, the following is arrived at:

$$\Delta V(t) = V_{read}\left[\frac{C_{\overline{BL}}}{C_{NEM}+C_{\overline{BL}}}\right].$$

5.5 Speed of 2T-1NEM Operations.

(a) Write Operations.

The transient analysis for the write operation of NEMRAM is more involved than the analysis put port above. As explained earlier, a voltage bias of $V_{write}$ is required in switching the state of NEMRAM, wherein it is reasonable to model the writing time $t_{write}$ by the following equation:

$$t_{write} = t_{write,electrical} + t_{write,mechanical}$$

where $t_{write,electrical}$ is the time required to charge the electrode to $V_{program}$ and $t_{write,mechanical}$ is the time required for the beam to move from one electrode to another.

Similar to the transient analysis for read operations, it is assumed that the cantilever is adhered to the electrode that is connected to the bit-line. As the voltage on $\overline{BL}$ is $V_{DD}$, the voltage on the electrode can be determined by the following equation, which yields the time required to charge up the air gap capacitor.

$$V_{\overline{electrode}}(t) = V_{DD} - V_{DD}e^{-t/R_{MOS}C_{NEM}} \quad (11)$$

Thus, the time for $V_{\overline{electrode}}$ to reach $V_{write}$ is given by:

$$t_{write,\ electrical} = R_{MOS}C_{NEM}\ln\left(\frac{V_{DD}}{V_{DD}-V_{write}}\right) \quad (12)$$

The time required for the cantilever to snap from one electrode deflection to another ($t_{write,mechanical}$) is dominated by the squeezed film damping, where the damping factor b is given by:

$$b = \frac{96\eta L_{si} W_{si}^3}{\pi^4 (t)^3} \quad (13)$$

However, delay times on this order are not suitable for high-speed memory applications. Therefore, in order to make NEMRAM speed competitive with conventional memory, it is preferable to operate the cells at low gas pressure to minimize damping, and thus to increase device speed. Low pressure operation can be achieved by encapsulating the devices in a vacuum during fabrication.

In response to low pressure operation, $t_{write,mechanical}$ becomes inertia dominated. By Newton's second law of mechanics (F=ma) and with the approximation that F is equal to the electrostatic force when the air-gap between the electrode and the beam is $2t_{gap}$, the following is arrived at:

$$\frac{1}{2}\frac{\varepsilon_{air}V_{write}^2}{(2t_{gap})^2}A_{gap} = \rho_{si} A t_{si} a \quad (14)$$

Example: $a = \dfrac{\varepsilon_{air}V_{write}^2}{8t_{gap}^2 \rho_{si} t_{si}}$ As $s = \dfrac{1}{2}a t_{write,mechanical}^2$, $t_{write,mechanical} = \sqrt{\dfrac{2(2t_{gap})}{\left(\dfrac{\varepsilon_{air}V_{write}^2}{8t_{gap}^2 \rho_{si} t_{si}}\right)}}$ After simplification, the following arises:

$$t_{write,mechanical} = \sqrt{\frac{32 t_{gap}^3 \rho_{si} t_{si}}{\varepsilon_{air} V_{write}^2}} \quad (15)$$

Thus, it can be written:

$$t_{write} = R_{MOS} C_{NEM} \ln\left(\frac{V_{DD}}{V_{DD} - V_{write}}\right) + \sqrt{\frac{32 t_{gap}^3 \rho_{si} t_{si}}{\varepsilon_{air} V_{write}^2}} \quad (16)$$

$$= R_{MOS} \frac{\varepsilon_{air}}{2 t_{gap}} W_{si} L_{si} \ln\left(\frac{V_{DD}}{V_{DD} - V_{write}}\right) + \sqrt{\frac{32 t_{gap}^3 \rho_{si} t_{si}}{\varepsilon_{air} V_{write}^2}}$$

With Eq. 4, Eq. 10, and Eq. 16 developed to compute $V_{write}$, $t_{read}$, and $t_{write}$, important characteristics of NEMRAM cells have been quantified.

5.6 Power Consumption of NEMRAM.

(a) Static Power Dissipation.

NEMRAM cells consume no static power as the data is stored in response to surface adhesion instead of in response to application of an external voltage source. The lack of a leakage path between $V_{DD}$ to ground equates to a static power consumption which is zero, and is of course a very significant benefit of this memory technology.

(b) Dynamic Power Dissipation.

The energy consumed for programming an NEMRAM cell generally consists of two parts. First, energy is expended to unstick ($E_{unstuck}$) the beam from one of the electrodes by charging up the air-gap capacitor from the other electrode. Second, energy is also consumed to snap ($E_{snap}$) the mechanical beam from one electrode to another, these are approximated as follows:

$$E_{unstuck} = \frac{1}{2} C_{NEM} A_{gap} \Delta V^2 \times t_{write,electrical}$$

$$= \frac{1}{2} C_{NEM} A_{gap} V_{write}^2 \times t_{write,electrical}$$

A value for $E_{snap}$ can be computed by considering the energy change due to the increase in the air-gap capacitor at $V_{write}$, for instance:

$$E_{snap} = \frac{1}{2} \Delta C_{NEM} A_{gap} V_{write}^2 \times t_{write,electrical}$$

$$E_{snap} = \frac{1}{2} C_{NEM} A_{gap} V_{write}^2 \times t_{write,electrical}$$

Accordingly, the following can be put forth, $$E_{dynamic} = \frac{1}{2} C_{NEM} A_{gap} V_{write}^2 \times t_{write,electrical} + \quad (17)$$

$$\frac{1}{2} C_{NEM} A_{gap} V_{write}^2 \times t_{write,mechanical}$$

$$= \frac{1}{2} C_{NEM} A_{gap} V_{write}^2 \times t_{write}$$

which is equivalent to the energy it takes to charge up a capacitor $C_{NEM}$ to $V_{write}$ in time $t_{write}$.

5.7 Endurance of NEMRAM Memory Cell.

Although the maximum number of cycles for operation of NEMRAM is not clear due to lack of experimental data, $10^{12}$ cycles for RF MEMS switches, which operate according to similar principles and scales to NEMRAM, have been reported. Thus, it is reasonable to believe that NEMRAM has a comparable lifetime ($10^{12}$ cycles) which favorable compares to other memories (e.g., MRAM).

5.8 Area of the Memory Cell.

Since 2T-1NEM memory cells require only two NMOS transistors, the active area can be reduced significantly in comparison with traditional 6T SRAM memories. Furthermore, as the mechanical beam does not require high quality single crystalline material, it can be stacked on top of the NMOS transistors.

Figure 46:
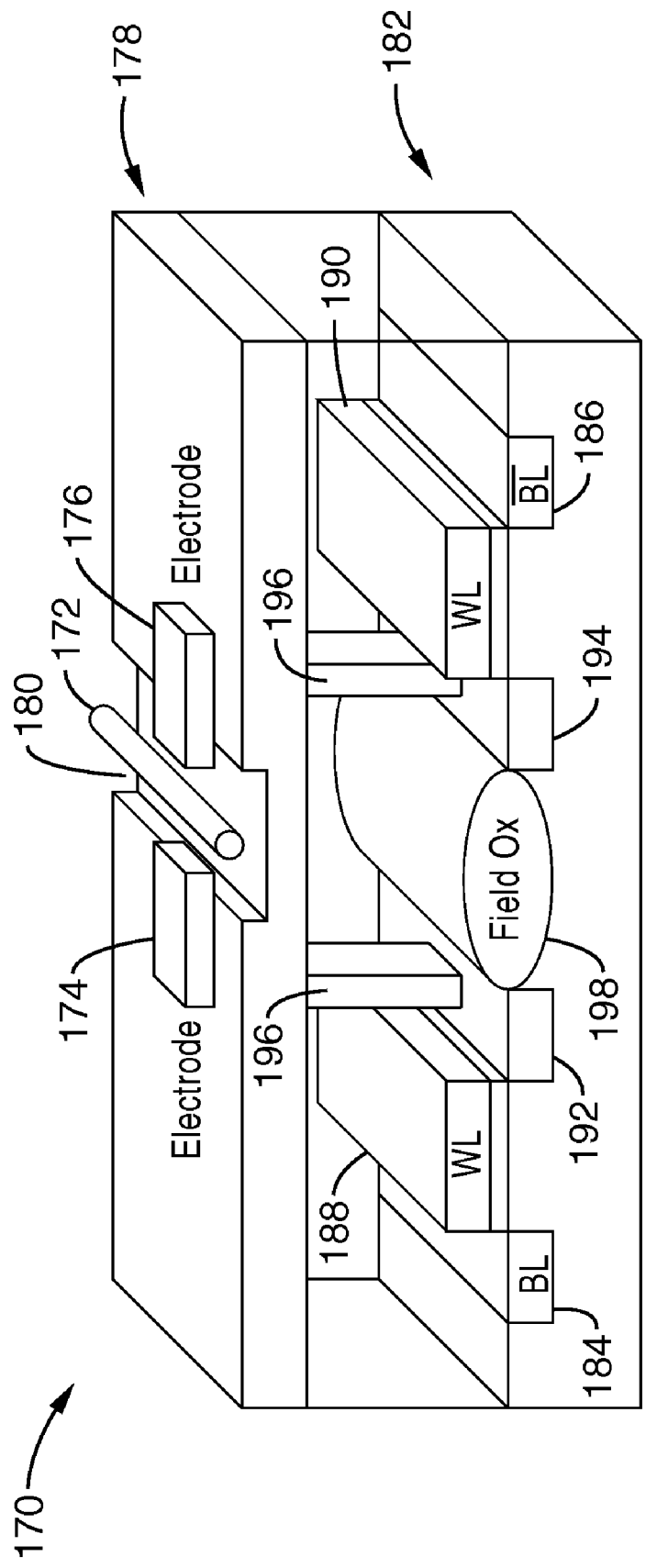
FIG. 46 is a perspective view of a stacked NEMRAM cell according to an embodiment of the present invention, showing a lower transistor layer, above which a bi-stable stiction mechanical beam is coupled.

FIG. 46 illustrates by way of example embodiment 170 the stacking of a mechanical beam 172 (shown without anchors for simplicity of illustration) directly on top of the two NMOS transistors, so as to maximize the density of the 2T-1NEM memory cell. In this cell a first electrode 174 and second electrode 176 are shown on first layer 178 (i.e., interlayer dielectric). The structure is preferably configured with a gap 180 between the beam and the first layer to prevent interference with beam motion. A second layer 182 is shown with bit-lines BL 184 and $\overline{BL}$ 186 as the drains of the NMOS transistor, and write-lines 188, 190 over gate regions of the NMOS transistor. NMOS transistor sources are shown 192, 194, which are coupled through conductive vias 196 to first and second electrodes 174, 176. A field oxide 198 is shown isolating the two NMOS devices.

Use of a stacked circuit configured has been shown feasible by previous work in which MEMS resonators were successfully fabricated directly on top of CMOS circuits. Furthermore, as previously illustrated in FIG. 35, the lateral mechanical beam and an independent gate FinFET are very similar in structure, wherein the dimensions of an NEMRAM can at least be made of comparable size to that of a FinFET which is in the nanoscale regime, and it appears likely the NEMRAM can be scaled down much further. The numerous structural similarities holds promise for fabricating NEM-RAMs utilizing the same general sets of tools utilized in the fabrication of FinFETs. Hence, the overall footprint area occupied by a 2T-1NEM is approximately the area of two minimum sized NMOS transistors. To the first order, this implies an area reduction over conventional devices of more than 60%.

5.9 Memory Retention Time.

One of the most significant advantages of 2T-1NEM over 6T SRAM memories is its non-volatility. For ubiquitous electronics applications like smart dust, this is favorable because NEMRAM can take on the roles of both flash and SRAM cache, wherein the delay time due to cache miss is eliminated. In addition, when a smart dust mode is awaked from its sleep mode, the data can be directly read from the NEMRAM without the need to waste time and power by loading data from external memory storage, such as FLASH.

6. CONCLUSION

As can be seen from the foregoing, NEMRAM is a new breed of memory utilizing a mechanical beam and a holding force derived from surface adhesion, or less preferably from stored charge, or a holding voltage, or a combination thereof, as the means of information storage. Several different 2T-1NEM topologies for NEMRAM operation have been described. The advantages with regard to scaling, power consumption, and non-volatility, of these memories over the traditional 6T SRAM have also been discussed. Other circuit topologies of NEMRAM, like the vertically stacked cross-point NEMRAM array for achieving ultra-high density (sub 4F² cell area), has also been discussed.

It should be appreciated that although a number of embodiments are described, the invention can be implemented according to different combinations of the elements described herein, for example varying the number of electrodes and charge trapping layers, the use of stiction force to overcome spring force, varying the shape and/or orientation of the moveable portion of the beam, and so forth.

In some implementations the function of the bit-line can be transposed with that of a word-line, without departing from the teachings herein.

The bit-line is shown having a constant cross-section (e.g., fixed thickness and width), however, it is not limited in this manner as it can be shaped to facilitate proper deflection, and so forth.

Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art. In any appended claims, which reference to an element in the singular is not intended to mean "one and only one" unless explicitly so stated, but rather "one or more." All structural, chemical, and functional equivalents to the elements of the above-described preferred embodiments that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A nano-electro-mechanical memory cell, comprising:
   at least one electrode within a nano-electro-mechanical memory cell;
   a mechanical beam having a portion configured for deflection toward at least one said electrode, said deflection arising in response to electrostatic force applied between said beam and at least one said electrode; and
   means for determining a data state for said nano-electro-mechanical memory cell in response to the positioning of said portion of said mechanical beam;
   wherein two positions of said mechanical beam define two data states;
   wherein said two positions comprise a non-deflected state and a deflected state, or two deflected states in different directions;
   wherein said memory cell is adapted for overcoming a spring restoring force of said mechanical beam in a deflected state in response to a holding force;
   wherein said holding force comprises:
      an electrostatic force created between said at least one electrode and said mechanical beam, or created from electrostatic force between a buried charge layer and said mechanical beam, or a combination of electrostatic force from at least one electrode and at least one buried charge layer; or
      stiction forces created from the interface between said mechanical beam in a deflected state and a contact surface; or
      a combination of electrostatic forces and stiction forces.

2. A memory cell as recited in claim 1, further comprising:
   a dielectric material on said at least one electrode;
   wherein said dielectric material is configured with a charge trapping region.

3. A memory cell as recited in claim 1, wherein said nano-electro-mechanical memory cell is configured with two electrodes, one on each side of said mechanical beam.

4. A memory cell as recited in claim 3, wherein said data state is determined in response to the position of said mechanical beam in contact with each of said two electrodes, or in contact with surfaces adjacent each of said two electrodes.

5. A nano-electro-mechanical memory cell, comprising:
   at least one electrode within a nano-electro-mechanical memory cell;
   a mechanical beam having a portion configured for deflection toward at least one said electrode, said deflection arising in response to electrostatic force applied between said beam and at least one said electrode; and
   means for determining a data state for said nano-electro-mechanical memory cell in response to the positioning of said portion of said mechanical beam;
   wherein said nano-electro-mechanical memory cell is configured with two electrodes, one on each side of said mechanical beam;
   wherein said data state is determined in response to the position of said mechanical beam as being deflected or non-deflected;
   wherein said deflected state is in response to a portion of said mechanical beam contacting either of said two electrodes or surfaces adjacent either of said two electrodes; and
   wherein said non-deflected state is in response to the portion of said mechanical beam not being in contact with either of said two electrodes or surfaces adjacent either of said two electrodes.

6. A nano-electro-mechanical memory cell, comprising:
   a first electrode within a nano-electro-mechanical memory cell;
   a second electrode separated by a gap from said first electrode; and
   a mechanical beam, a portion of said mechanical beam positioned in said gap;
   wherein said mechanical beam is moveable between a position where said beam is in contact with said first electrode and a position where said beam is in contact with a dielectric material on said second electrode;
   wherein movement of said beam is effected by electrostatic force between said beam and at least one of said electrodes; and
   wherein data states of said nano-electro-mechanical memory cell are determined in response to detecting the positioning of said portion of said mechanical beam;
   wherein said dielectric material comprises an oxide-nitride-oxide (ONO) stack configured for charge trapping; and
   wherein said ONO stack is positioned between said mechanical beam and said second electrode.

7. A memory cell as recited in claim 6:
wherein said memory cell comprises a non-volatile memory cell.

8. A nano-electro-mechanical memory cell, comprising:
a first electrode within a nano-electro-mechanical memory cell;
a second electrode separated by a gap from said first electrode; and
a mechanical beam, a portion of said mechanical beam positioned in said gap;
wherein said mechanical beam is moveable between a position where said beam is in proximity or contact with said first electrode and a position where said beam is in proximity or contact with said second electrode or a dielectric material on said second electrode;
wherein movement of said beam is effected by electrostatic force between said beam and at least one of said electrodes;
wherein data states of said nano-electro-mechanical memory cell are determined in response to detecting the positioning of said portion of said mechanical beam;
wherein said memory cell has two stable data states determined in response to the position of said mechanical beam;
wherein said at least two stable states are characterized by stiction of said mechanical beam to said first electrode or said second electrode, or to a surface proximal said first electrode or said second electrode; and
wherein said stiction must be overcome in response to a sufficient electrostatic force applied between the electrodes and the mechanical beam to allow the memory cell to change states.

9. A nano-electro-mechanical memory cell, comprising:
a first electrode within a nano-electro-mechanical memory cell;
a second electrode separated by a gap from said first electrode; and
a mechanical beam, a portion of said mechanical beam positioned in said gap;
wherein said mechanical beam is moveable between a position where said beam is in proximity or contact with said first electrode and a position where said beam is in proximity or contact with said second electrode or a dielectric material on said second electrode;
wherein movement of said beam is effected by electrostatic force between said beam and at least one of said electrodes;
wherein data states of said nano-electro-mechanical memory cell are determined in response to detecting the positioning of said portion of said mechanical beam;
wherein said first electrode is configured as a word-line;
wherein said second electrode is configured as an erase electrode; and
wherein said mechanical beam is configured as a bit-line.

10. A memory cell as recited in claim 9, wherein said bit-line is used to store and read out state information, data, from the memory cell.

11. A nano-electro-mechanical memory cell, comprising:
a first electrode within a nano-electro-mechanical memory cell;
a second electrode separated by a gap from said first electrode; and
a mechanical beam, a portion of said mechanical beam positioned in said gap;
wherein said mechanical beam is moveable between a position where said beam is in proximity or contact with said first electrode and a position where said beam is in proximity or contact with said second electrode or a dielectric material on said second electrode;
wherein movement of said beam is effected by electrostatic force between said beam and at least one of said electrodes;
wherein data states of said nano-electro-mechanical memory cell are determined in response to detecting the positioning of said portion of said mechanical beam;
wherein said first electrode is configured as a read word-line;
wherein said second electrode is configured as an write word-line; and
wherein said mechanical beam is coupled to a bit-line within a memory device through at least one transistor, said bit-line utilized to store and read out state information from the memory cell.

12. A nano-electro-mechanical memory cell, comprising:
a first electrode within a nano-electro-mechanical memory cell;
a second electrode separated by a gap from said first electrode; and
a mechanical beam, a portion of said mechanical beam positioned in said gap;
wherein said mechanical beam is moveable between a position where said beam is in proximity or contact with said first electrode and a position where said beam is in proximity or contact with said second electrode or a dielectric material on said second electrode;
wherein movement of said beam is effected by electrostatic force between said beam and at least one of said electrodes;
wherein data states of said nano-electro-mechanical memory cell are determined in response to detecting the positioning of said portion of said mechanical beam;
wherein said first electrode is configured as a read word-line;
wherein said second electrode contains no charge storage region and is configured as an control word-line; and
wherein said mechanical beam is coupled to a bit-line within a memory device through at least one transistor, said bit-line utilized to store and read out state information, data, from the memory cell.

13. A nano-electro-mechanical memory cell, comprising:
a first electrode within a nano-electro-mechanical memory cell;
a second electrode separated by a gap from said first electrode; and
a mechanical beam, a portion of said mechanical beam positioned in said gap;
wherein said mechanical beam is moveable between a position where said beam is in proximity or contact with said first electrode and a position where said beam is in proximity or contact with said second electrode or a dielectric material on said second electrode;
wherein movement of said beam is effected by electrostatic force between said beam and at least one of said electrodes;
wherein data states of said nano-electro-mechanical memory cell are determined in response to detecting the positioning of said portion of said mechanical beam;
wherein said mechanical beam and said first and second electrodes are retained upon a first layer, with at least one access transistor retained upon a second layer and operably coupled to said first layer for reading the data state associated with the position of said mechanical beam.

14. A nano-electro-mechanical memory cell, comprising:
a first electrode within a nano-electro-mechanical memory cell;
a second electrode separated by a gap from said first electrode;
a mechanical beam, a portion of said mechanical beam positioned in the gap between said first and second electrodes; and
a dielectric stack positioned between said mechanical beam and said second electrode and configured for trapping charges;
wherein said mechanical beam is moveable between a position where said beam comes into contact with said first electrode during a read operation or remains in a position where said beam is in contact with said dielectric stack in response to the trapped charges; and
wherein movement of said beam is in response to application of a sufficient electrostatic force between said beam and at least one of said electrodes to overcome mechanical forces operating on the beam and electrostatic forces arising from nearby trapped charges;
wherein data states of said nano-electro-mechanical memory cell are determined in response to said read configured for detecting the positioning of said portion of said mechanical beam.

15. A memory cell as recited in claim 14, wherein said mechanical forces which operate on the beam comprise spring forces, deformation forces and stiction forces.

16. A memory cell as recited in claim 14, wherein said dielectric stack comprises an oxide-nitride-oxide (ONO) stack.

17. A memory cell as recited in claim 14:
wherein said first electrode is configured as a word-line;
wherein said second electrode is configured as an erase electrode;
wherein said mechanical beam is configured as a bit-line; and
wherein said dielectric stack is configured for charge trapping.

18. A memory cell as recited in claim 17, wherein said bit-line is used to store and read out the state information of the memory cell.

19. A memory cell as recited in claim 14, wherein said charge trapping in said dielectric stack operates to increase or decrease the resultant electrostatic force applied between said beam and at least one of said electrodes.

20. A memory cell as recited in claim 1 or 5, wherein said means for determining a data state comprises at least one transistor coupled to said mechanical beam and configured for detecting the position of said mechanical beam in response to detection of electrical characteristics.

21. A memory cell as recited in claim 1 or 5, wherein said means for determining a data state senses the data state in response to the level of current flow in said mechanical beam.

22. A memory cell as recited in claim 1, 5, 6, 8, 9, 11, 12, or 13 wherein said electrostatic force is generated by applying a voltage between said beam and said electrode.

23. A memory cell as recited in claim 1, 5, 6, 8, 9, 11, 12, or 13 wherein said memory cell comprises a non-volatile static ram (SRAM) memory cell.

24. A memory cell as recited in claim 1, 5, 6, 8, or 9 further comprising at least one access transistor for writing and reading the state of said memory cell.

25. A memory cell as recited in claim 1, 5, 6, 8, or 9 further comprising at least one access transistor coupled to each end of said mechanical beam for writing and reading the state of said memory cell.

26. A memory cell as recited in claim 6, 9, 11, 12, or 13 wherein said memory cell has at least two stable data states determined in response to the position of said mechanical beam.

27. A memory cell as recited in claim 5, 6, 8, 9, 11, 12, 13, or 14, wherein said mechanical beam is anchored on at least one end.

28. A memory cell as recited in claim 1, 6, 8, or 9, wherein said mechanical beam is coupled to a bit-line through at least one transistor.

* * * * *